(12) United States Patent
Miyazaki

(10) Patent No.: US 7,461,281 B2
(45) Date of Patent: Dec. 2, 2008

(54) CAPACITIVE LOAD DRIVING CIRCUIT, ELECTROSTATIC TRANSDUCER, METHOD OF SETTING CIRCUIT CONSTANT, ULTRASONIC SPEAKER, DISPLAY DEVICE, AND DIRECTIONAL ACOUSTIC SYSTEM

(75) Inventor: Shinichi Miyazaki, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 62 days.

(21) Appl. No.: 11/564,651

(22) Filed: Nov. 29, 2006

(65) Prior Publication Data
US 2007/0124620 A1 May 31, 2007

(30) Foreign Application Priority Data
Nov. 29, 2005 (JP) ............................. 2005-343307
Oct. 16, 2006 (JP) ............................. 2006-281683

(51) Int. Cl.
G06F 1/00 (2006.01)
H04R 5/02 (2006.01)
(52) U.S. Cl. ..................... 713/323; 381/306; 381/311
(58) Field of Classification Search ................. 713/323
See application file for complete search history.

(56) References Cited
U.S. PATENT DOCUMENTS
5,731,722 A * 3/1998 Sugiki et al. ................. 327/111

6,643,377 B1 * 11/2003 Takahashi et al. ........... 381/306
6,807,281 B1 * 10/2004 Sasaki et al. ................. 381/111
7,015,905 B2 * 3/2006 Onozawa et al. ............. 345/212
7,210,785 B2 * 5/2007 Matsuzawa et al. ........... 353/15
7,244,007 B2 * 7/2007 Ishizaki ........................ 347/5

FOREIGN PATENT DOCUMENTS
JP A-2001-086587 3/2001
JP A-2002-158550 5/2002

* cited by examiner

Primary Examiner—Suresh K Suryawanshi
(74) Attorney, Agent, or Firm—Oliff & Berridge, PLC

(57) ABSTRACT

A capacitive load driving circuit includes an error amplification circuit that amplifies a difference between an external input signal provided to one input terminal and a negative feedback signal provided from the negative feedback circuit to another input terminal; a modulation circuit; a power switching circuit; a gate driving circuit; a low-pass filter connected to an output side of the power switching circuit and that removes switching carrier components included in an output signal of the power switching circuit; an output transformer that boosts an output signal of the low-pass filter and has a primary winding connected to an output terminal of the filter; a capacitive load that is connected in parallel with a secondary winding of the output transformer; and the negative feedback circuit performs a negative feedback from the output terminal of the low-pass filter to an input side of the error amplification circuit.

21 Claims, 23 Drawing Sheets

2; CAPACITIVE LOAD DRIVING CIRCUIT

EQUIVALENT CIRCUIT DIAGRAM OF OUTPUT CIRCUIT
(CONVERTED LOAD ELECTROSTATIC CAPACITANCE
INTO PRIMARY WINDING OF TRANSFORMER)

GAIN-PHASE FREQUENCY CHARACTERISTIC
OF OUTPUT CIRCUIT

LOOP GAIN, PHASE CHARACTERISTIC

LOAD TERMINAL VOLTAGE (OUTPUT VOLTAGE)
FREQUENCY CHARACTERISTIC
(CLOSED LOOP GAIN CHARACTERISTIC)

OUTPUT VOLTAGE FREQUENCY CHARACTERISTIC
CORRESPONDING TO LOAD CHANGE

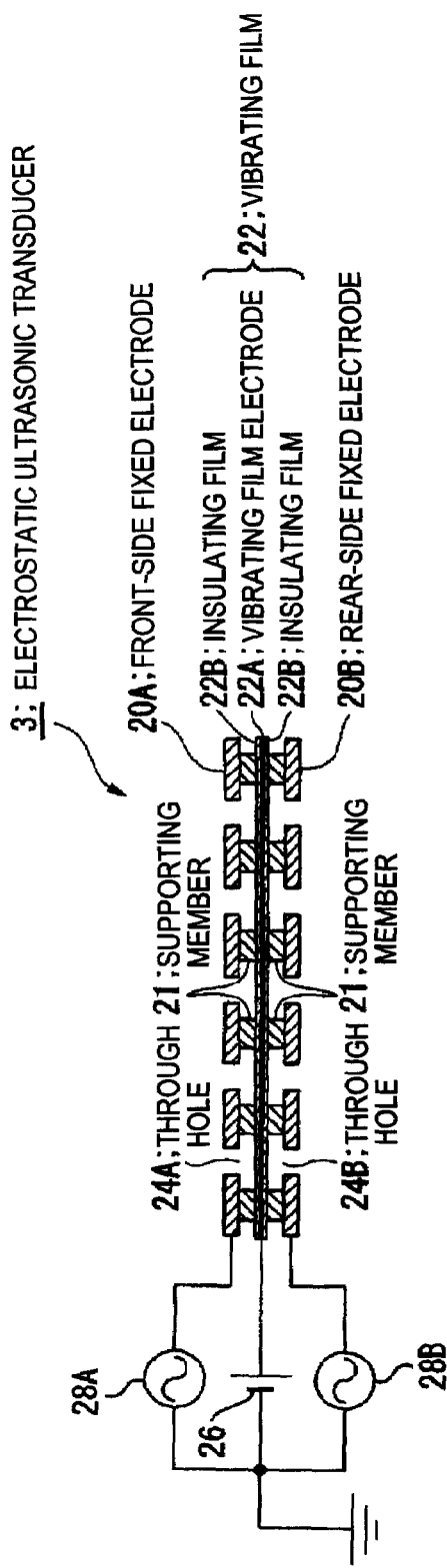
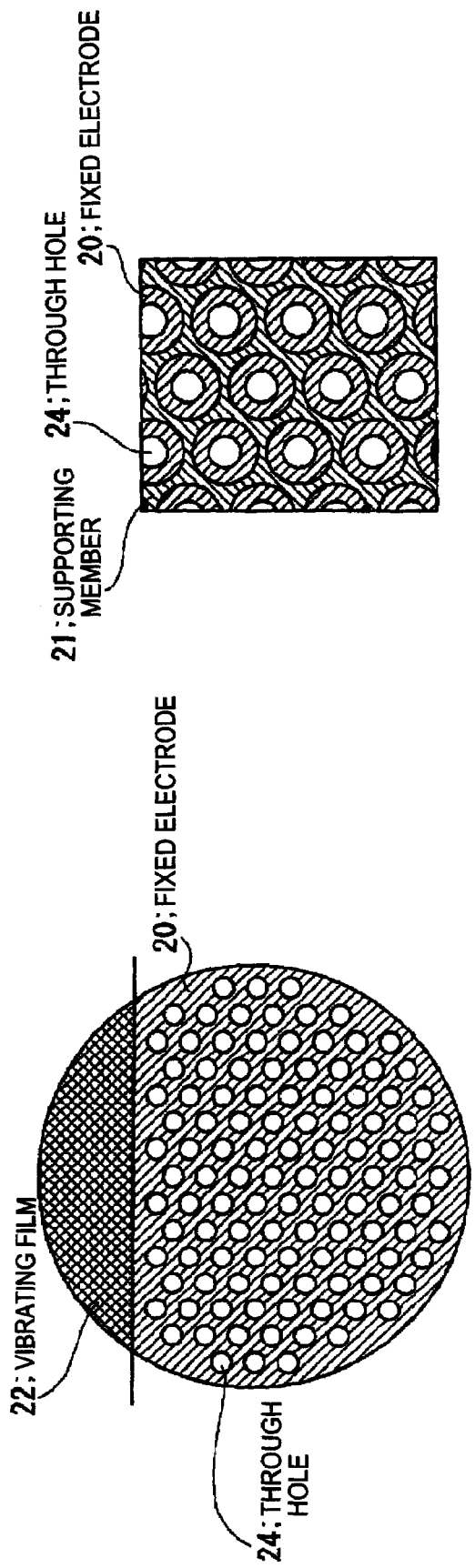
FIG. 11A
FIG. 11B
FIG. 11C

CIRCUIT CONFIGURATION OF FULL BRIDGE
(ANALOG CONTROL)

CIRCUIT CONFIGURATION OF BRIDGE (DIGITAL CONTROL)

CONCRETE STRUCTURE EXAMPLE OF CIRCUIT OF FIG. 14

STRUCTURE EXAMPLE OF CIRCUIT IN WHICH ELECTROSTATIC ULTRASONIC TRANSDUCER IS USED AS A LOAD

BASIC STRUCTURE OF CLASS-D POWER AMPLIFIER

FREQUENCY CHARACTERISTIC OF SECONDARY LC LOW-PASS FILTER

CAPACITIVE LOAD DRIVING CIRCUIT, ELECTROSTATIC TRANSDUCER, METHOD OF SETTING CIRCUIT CONSTANT, ULTRASONIC SPEAKER, DISPLAY DEVICE, AND DIRECTIONAL ACOUSTIC SYSTEM

CROSS-REFERENCE TO RELATED APPLICATION

This application claims priority from Japanese Patent Application Nos. 2005-343307 and 2006-281683, filed in the Japanese Patent Office on Nov. 29, 2005 and Oct. 16, 2006, respectively, the entire disclosures of which are hereby incorporated by reference in their entireties.

BACKGROUND

1. Technical Field

The invention relates to a capacitive load driving circuit using class-D (digital) power amplifier, an electrostatic transducer, a method of setting a circuit constant, an ultrasonic speaker, a display device, and a directional acoustic system, and more particularly, to a circuit configuration of class-D power amplifier that is suitable for driving the ultrasonic speaker for reproducing a sound having fine directivity by outputting a modulation wave, of which a carrier wave in an ultrasonic frequency band is modulated by an acoustic signal in an audible frequency band, from the electrostatic transducer serving as a capacitive load.

2. Related Art

An ultrasonic speaker may reproduce a sound having fine directivity by outputting a modulation wave of which a carrier wave in an ultrasonic frequency band is modulated by an acoustic signal in an audible frequency band.

As a transducer (transmitter) of the ultrasonic speaker, a piezoelectric transducer has been generally used. However, the piezoelectric transducer may obtain a high sound pressure by using a fine resonance characteristic of elements, but the frequency band thereof is very narrow. For this reason, the ultrasonic speaker using the piezoelectric transducer have problems in which the reproducible frequency band is narrow, and a reproduced sound quality is poor as compared to a loudspeaker. Therefore, various inventions have been studied so as to improve the above problems (for example, see JP-A-2001-86587).

Compared with this, an electrostatic transducer allowing an electrostatic force to act between an electrode of a vibrating film and a fixed electrode to generate a sound pressure by vibrating the vibrating film has been used as the transducer of the ultrasonic speaker (see an example of the electrostatic ultrasonic transducer shown in FIGS. 11A to 11C). The electrostatic transducer has a characteristic that can obtain a flat output sound pressure over a wide frequency range. For this reason, the ultrasonic speaker using the electrostatic transducer can improve the reproduced sound quality as compared to that using the piezoelectric transducer.

However, when the electrostatic transducer is driven by an analog amplifier, there have been problems as follows.

FIGS. 21A and 21B show examples of single end push pull circuit. A difference in loss between the case where a resistive load is driven and the case where capacitive load is driven by the general analog power amplifier will be described on the basis of the example. As shown in FIGS. 21A and 21B, the single end push pull circuit in which an NPN transistor Tr1 and a PNP transistor Tr2 are totem-pole-connected to up and down of an output stage (electrode amplifying stage) has been used in the general analog power amplifier. The output stage transistors are operated with class-A or class-AB (class-B).

FIG. 21A shows an example for driving a load resistance RL serving as a resistive load, and FIG. 21B shows an example for driving a load capacitance (for example, electrostatic transducer) CL serving as a capacitive load.

FIGS. 22A and 22B are views showing an example of power loss generating at the output stage transistor (one side) of the analog power amplifier, and shows the relationship between collector-emitter voltage VCE and collector current IC of the upper transistor Tr1 shown in FIGS. 21A and 21B where the output stage transistor is operated with class-B.

In the case of the resistive load, since the phase of an output voltage (load voltage) is approximately equal to that of an output current (load current), the phase relationship between the collector-emitter voltage VCE and the collector current IC of the transistor is a reversed relationship as illustrated in FIG. 22A. That is, when the output current IC is maximum value, the collector-emitter voltage VCE is minimized. While, when the output current IC is minimum value, the collector-emitter voltage VCE is maximized.

Compared to this, in the case of the load capacitance CL, since the phase of the output voltage (load voltage) is out of phase with the output current (load current) by about 90 degrees, the phase relationship between the collector-emitter voltage VCE and the collector current IC is out of by about 90 degrees, as shown in FIG. 22B. At this time, when the output current IC is maximum value, since the collector-emitter voltage VCE is not minimized and has a large value, large loss WQ is generated in the transistor. Therefore, the power loss larger than that in the case of the resistive load is generated in the transistor.

As described above, in the case of driving the electrostatic transducer (capacitive load) by the general analog power amplifier, the power loss of the capacitive load is larger than that of the resistive load at the same output power. Accordingly, the power amplifier when the electrostatic transducer is driven by the analog power amplifier requires larger output than that when the resistive load is driven, thereby the device becomes larger.

Meanwhile, recently, class-D power amplifier for switching the output stage transistor by an audio power amplifier has been popularized (for example, see JP-A-2002-158550). The class-D power amplifier uses a power MOSFET having small ON resistance in an output stage element and reduces the loss in the output stage element by switching the power MOSFET. Since the loss in the output stage element of the class-D power amplifier is small as compared to the analog amplifier, the class-D power amplifier omits a radiator that is essential to the analog amplifier or may be miniaturized. Accordingly, it is possible to realize the amplifier of high output with a small size. For this reason, the class-D power amplifier is widely employed to, for example, in-car amplifier or portable terminal amplifier in which miniaturization and low loss are required, and AV amplifier having numerous output channels.

FIG. 23 is a view showing a general structure example of the class-D power amplifier. In the class-D power amplifier shown in FIG. 23, a PWM modulation circuit 42 modulates an input signal 41 into a digital signal of high frequency by using a PWM (Pulse Width Modulation) method or a PDM (Pulse Density Modulation) method. Then, class-D output stage 44 is driven by a gate driving circuit 43. The class-D output stage 44 uses a power MOSFET having a small ON resistance. The gate driving circuit 43 operates the power MOSFET in a saturated region, that is, performs a switching operation (ON/OFF operation). When the power MOSFET is OFF state, since the current hardly flows, the loss in the power MOSFET is approximately zero (0). In contrast, when the power MOS- FET is ON state, the current flows toward the load, but the resistance of the power MOSFET at ON state, that is, ON resistance is very small as much as several mΩ to several tens of mΩ. Therefore, even though the high current flows, the loss in the power MOSFET may be restrained so as to be very low. For this reason, since the loss in the output stage element of the class-D power amplifier 40 is small as compared to the analog amplifier, it is possible to realize the amplifier of the high output with a small size.

As described above, since the output of the class-D output stage 44 becomes a switching waveform (modulated waveform), it is necessary to supply into the load after switching carrier component is removed by a low-pass filter. LC low-pass filter (LPF) 45 having small power loss is generally used as the low-pass filter.

However, the LC low-pass filter is connected to a proper load resistance and may obtain the effective frequency characteristic of the low-pass filter for the first time. For example, FIG. 24 shows an example of the frequency characteristic of second-order LC low-pass filter when cutoff frequency is set to about 50 kHz, but can understand that the response near the cutoff frequency is largely different according to the load resistance RL value.

As described above, if the load resistance RL value connecting to the LC low-pass filter is too low, the frequency characteristic becomes too dull, thereby gain degradation in the driving frequency band becomes large. On the contrary, if the load resistance RL value is too high, the frequency characteristic having large peak is generated. Impedance of the loudspeaker is generally 4 to 8 Ω. Therefore, when the load of 4 to 8 Ω is connected, the LC low-pass filter is designed in the general class-D power amplifier for audio so that the frequency characteristic becomes flat.

Unlike the loud speaker, since the electrostatic transducer is the same structure as a capacitor, the capacitance component is dominant as the impedance of the transducer. As an equivalent circuit, resistance component that is connected in series with the electrostatic capacitance component of the load, so called, an equivalent series resistance (ESR) is remarkably small, and the resistance component that is connected in parallel with the capacitance component of the load is remarkably large. Inductance component exists, but the value thereof is minute. Therefore, the inductance component is disregarded herein.

Accordingly, if the electrostatic transducer is connected with the output of the LC low-pass filter, it is equal to the state in which the output of the LC low-pass filter is opened. Therefore, the output of the LC low-pass filter shows the response having very sharp peak in the vicinity of a resonant frequency. For this reason, if driving the electrostatic transducer as the load by using the general class-D power amplifier for audio (if removing the switching carrier component by the LC low-pass filter of the class-D power amplifier), the large peak is generated in the frequency characteristic of the output (for example, see curve when R is 16 Ω in FIG. 24). Therefore, it may be impossible to obtain the flat frequency characteristic, and the operation may be unstable in the worst case. More particularly, when the electrostatic transducer is used as the ultrasonic speaker, if the flat frequency characteristic is not obtained, the reproduced sound quality becomes poor.

If an external resistance having a proper value is connected to the electrostatic transducer, it can obtain the flat frequency characteristic, but in exchange therefor the large power loss is generated due to the resistance. Since this causes the advantage of the electrostatic transducer in which the loss is small to be reduced, the above method is not preferable.

As described above, if driving the electrostatic transducer (capacitive load) as the load by using the general class-D power amplifier for audio, the large peak is generated in the frequency characteristic of the output. Therefore, it may be impossible to obtain the flat frequency characteristic, and the operation may be unstable in the worst case. More particularly, when the electrostatic transducer is used as the ultrasonic speaker, if the flat frequency characteristic is not obtained, the reproduced sound quality becomes poor.

If an external resistance having a proper value is connected to the electrostatic transducer, it can obtain the flat frequency characteristic, but in exchange therefor the large power loss is generated due to the resistance. Since this causes the advantage of the electrostatic transducer in which the loss is small to be reduced.

SUMMARY

An advantage of some aspects of the invention is that it provides a capacitive load driving circuit, an electrostatic transducer, a method of setting a circuit constant, an ultrasonic speaker, a display device, and a directional acoustic system in which loss is small when the capacitive load is driven by using class-D power amplifier, and a flat frequency characteristic in a driving frequency band can be realized.

According to an aspect of the invention, a capacitive load driving circuit includes: an error amplification circuit that amplifies a difference between an external input signal provided to one input terminal and a negative feedback signal provided from the following negative feedback circuit to the other input terminal; a modulation circuit that pulse-modulates the signal outputted from the error amplification circuit; a power switching circuit that switches between a power supply voltage and a ground potential or between a positive power supply voltage and a negative power supply voltage; a gate driving circuit that generates a gate driving signal for switching-controlling a switching element configuring the power switching circuit, from a modulated signal outputted from the modulation circuit; a low-pass filter that is connected to an output side of the power switching circuit and removes switching carrier components included in an output signal of the power switching circuit; an output transformer that boosts an output signal of the low-pass filter and has a primary winding connected to an output terminal of the low-pass filter; a capacitive load that is connected in parallel with a secondary winding of the output transformer; and a negative feedback circuit that performs a negative feedback from the output terminal of the low-pass filter to an input terminal of the error amplification circuit.

With this configuration, the low-pass filter (LC low-pass filter or the like) is provided at the output side of the power switching circuit (for example, the output stage of the class-D power amplifier), and the output of the low-pass filter is applied to the load capacitance (for example, electrostatic transducer or the like) through the output transformer. As described above, the driving circuit of the load capacitance is configured by combining the output filter and the power switching circuit. The output filter is formed with the LC low-pass filter, the output transformer, and the load capacitance. In addition, the negative feedback signal from a rear stage of the low-pass filter is feed-backed toward the input terminal of the error amplification circuit, and the error amplification circuit amplifies the error signal between the negative feedback signal and the external input signal. The amplified error signal is pulse-modulated (for example, PWM modulation or PDM modulation) by the modulation circuit. The gate driving circuit generates the gate signal of the switching element of the power switching circuit on the basis of the modulation signal generated by the modulation circuit, and the switching element is ON/OFF controlled.

For this reason, it can realize a flat output frequency characteristic without the connection of a load resistance (damper resistance) to the load capacitance. In addition, since the load resistance is not required, the loss due to the load resistance and the loss generated by the output stage element of the power switching circuit can be simultaneously reduced. Therefore, the entire circuit including the load may be driven with abundantly high efficiency. Furthermore, since the negative feedback is performed from the back of the LC low-pass filter, that is, the front of the output transformer, even though the load capacitance is varied, the flat frequency characteristic (passing characteristic) may be stably realized so as to have a small variation. Accordingly, for example, when the electrostatic transducer is used as the load capacitance, the electrostatic transducer may be stably driven in a broadband. Particularly, when the driving circuit according to the aspect of the invention is used to an ultrasonic speaker, a reproduced sound quality due to the flat output characteristic may be improved.

Further, according to the above capacitive load driving circuit, it is preferable that the error amplification circuit includes an integrator.

With this configuration, when the error signal between the external input signal and the negative feedback signal from the rear stage of the low-pass filter (LC low-pass filter or the like) is amplified by the error amplification circuit, the error amplification circuit has the integral function (integrator) of the error signal.

For this reason, it may control the negative feedback signal and the external input signal so as to accord to each other without generating a steady-state offset (steady-state deviation) in the error signal.

In addition, according to the above capacitive load driving circuit, it is preferable that the low-pass filter is a second-order LC low-pass filter.

With this configuration, the low-pass filter provided at the back of the power switching circuit (the output stage or the like of the class-D power amplifier) is regarded as the second-order LC low-pass filter. For this reason, it may remove switching carrier components without consumption of the output power from the power switching circuit (the output stage or the like of the class-D power amplifier). Further, since the negative feedback is performed from the back of the second-order LC low-pass filter, a phase rotational amount of the negative feedback signal may be restricted within 180 degrees. Therefore, it may stably control the negative feedback by suppressing oscillation of the negative feedback circuit.

In addition, according to the above capacitive load driving circuit, it is preferable that the negative feedback circuit includes a phase compensation circuit.

With this configuration, the phase compensation circuit is provided in the negative feedback circuit. For this reason, it may stably control the negative feedback by expanding a phase margin of the negative feedback.

Further, according to the above capacitive load driving circuit, it is preferable that an output circuit formed by the low-pass filter, the output transformer, and a load capacitance has two parallel resonance frequencies f1 and f3 and two serial resonance frequencies f2 and f4 (f1<f2<f3<f4), as viewed from an input side. Furthermore, a constant of each circuit element configuring the output circuit may be set so that the first parallel resonance frequency f1 of the resonance frequencies matches or approximately matches a rated driving frequency or a carrier wave frequency fd of the capacitive load.

With this configuration, the circuit constant is set such that the parallel resonance frequency f1 of the load side in which the class-D power amplifier drives matches or approximately matches the rated driving frequency or the carrier wave frequency of the capacitive load.

For this reason, impedance of the load side becomes high in the driving frequency band of the load capacitance, and the output current from the power switching circuit (the output stage or the like of class-D power amplifier) is reduced. Therefore, it is possible to reduce the power loss.

In addition, according to the above capacitive load driving circuit, it is preferable that an output circuit formed by the low-pass filter, the output transformer, and a load capacitance has two parallel resonance frequencies f1 and f3 and two serial resonance frequencies f2 and f4 (f1<f2<f3<f4), as viewed from an input side. Furthermore, a constant of each circuit element configuring the output circuit may be set so that the first serial resonance frequency f2 of the resonance frequencies matches or approximately matches a cutoff frequency fc in a driving frequency band of the capacitive load.

With this configuration, the circuit constant is set such that the first serial resonance frequency f2 matches or approximately matches the cutoff frequency in the driving frequency band (passing band) of the load capacitance.

For this reason, the passing of the frequency component higher than the driving frequency band (passing band) of the load capacitance is effectively prevented, and thus an output noise becomes small.

In addition, according to the above capacitive load driving circuit, it is preferable that an output circuit formed by the low-pass filter, the output transformer, and a load capacitance has two parallel resonance frequencies f1 and f3 and two serial resonance frequencies f2 and f4 (f1<f2<f3<f4), as viewed from an input side. Further, a leakage inductance of the output transformer and the other circuit constant may be set so that the second serial resonance frequency f4 of the resonance frequencies is positioned below a modulation frequency band of the modulation circuit.

With this configuration, each circuit constant is set such that the second serial resonance frequency f4 of the resonance frequencies is positioned below the modulation frequency band (switching frequency band (carrier frequency band for modulation) of the power switching circuit) of the modulation circuit.

For this reason, since a damping slope of the low-pass filter increases in the switching frequency band of the power switching circuit (the output stage or the like of the class-D power amplifier), the switching carrier components are sufficiently removed in the power switching circuit output, and thus the output noise becomes small.

In addition, according to the above capacitive load driving circuit, it is preferable that the capacitive load is an electrostatic transducer, the electrostatic transducer includes a first electrode that has a plurality of holes, a second electrode that has a plurality of holes making pairs with the holes of the first electrode, and a vibrating film that has a conductive layer and is inserted between a pair of electrodes formed with the first and second electrodes, a direct current bias voltage being applied to the conductive layer, the secondary winding of the output transformer is provided with a center tap, one terminal of the secondary winding of the output transformer is connected to a first electrode of the electrostatic transducer, and the other terminal thereof is connected to a second electrode of the electrostatic transducer, and the direct current bias voltage based on the center tap of the secondary winding of the output transformer is applied to the conductive layer of the vibrating film.

With this configuration, by using the electrostatic transducer of a push pull type shown in FIGS. 11A to 11C as the load capacitance driving by the capacitive load driving circuit according to the aspect of the invention, one terminal of the secondary winding of the output transformer T is connected to the front fixed electrode (first electrode), and the other terminal thereof is connected to the rear fixed electrode (second electrode), and the direct current bias voltage based on the center tap of the secondary winding of the output transformer T is applied to the conductive layer (vibrating film electrode) of the vibrating film.

For this reason, the electrostatic transducer of the push pull type may be driven with a low loss in a broadband. Particularly, when the electrostatic transducer is used as the ultrasonic speaker, the reproduced sound quality due to the flat output characteristic may be improved.

According to another aspect of the invention, an electrostatic transducer includes: an error amplification circuit that amplifies a difference between an external input signal provided to one input terminal and a negative feedback signal provided from the following negative feedback circuit to the other input terminal; a modulation circuit that pulse-modulates the signal outputted from the error amplification circuit; a power switching circuit that switches between a power supply voltage and a ground potential or between a positive power supply voltage and a negative power supply voltage; a gate driving circuit that generates a gate driving signal for switching-controlling a switching element configuring the power switching circuit, from a modulated signal outputted from the modulation circuit; a low-pass filter that is connected to an output side of the power switching circuit and removes switching carrier components included in an output signal of the power switching circuit; a negative feedback circuit that performs a negative feedback from the output terminal of the low-pass filter to an input terminal of the error amplification circuit; and an output transformer that boosts an output signal of the low-pass filter and has a primary winding connected to an output terminal of the low-pass filter. In this case, the electrostatic transducer may be connected in parallel with a secondary winding of the output transformer and driven as a capacitive load.

With this configuration, the low-pass filter (LC low-pass filter or the like) is provided at the output side of the power switching circuit (for example, the output stage of the class-D power amplifier), and the output of the low-pass filter is applied to the electrostatic transducer (load capacitance) through the output transformer. As described above, the driving circuit of the electrostatic transducer is configured by combining the output filter and the power switching circuit. The output filter is formed with the LC low-pass filter, the output transformer, and the load capacitance. In addition, the negative feedback signal from a rear stage of the low-pass filter is feed-backed toward the input terminal of the error amplification circuit, and the error amplification circuit amplifies the error signal between the negative feedback signal and the external input signal. The amplified error signal is pulse-modulated (for example, PWM modulation or PDM modulation) by the modulation circuit. The gate driving circuit generates the gate signal of the switching element of the power switching circuit on the basis of the modulation signal generated by the modulation circuit, and the switching element is ON/OFF controlled.

For this reason, it can realize a flat output frequency characteristic without the connection of a load resistance (damper resistance) to the electrostatic transducer. In addition, since the load resistance is not required, the loss due to the load resistance and the loss generated by the output stage element of the power switching circuit can be simultaneously reduced. Therefore, the entire circuit including the load may be driven with abundantly high efficiency. Furthermore, since the negative feedback is performed from the back of the LC low-pass filter, that is, the front of the output transformer, even though the load capacitance of the electrostatic transducer is varied, the flat frequency characteristic (passing characteristic) may be stably realized so as to have a small variation. Accordingly, the electrostatic transducer may be stably driven in a broadband. Particularly, when the electrostatic transducer according to the aspect of the invention is used to an ultrasonic speaker, a reproduced sound quality due to the flat output characteristic may be improved.

Further, according to the above electrostatic transducer, it is preferable that the error amplification circuit includes an integrator.

With this configuration, when the error signal between the external input signal and the negative feedback signal from the rear stage of the low-pass filter (LC low-pass filter or the like) is amplified by the error amplification circuit, the error amplification circuit has the integral function (integrator) of the error signal.

For this reason, it may control the negative feedback signal and the external input signal so as to accord to each other without generating a steady-state offset (steady-state deviation) in the error signal.

In addition, according to the above electrostatic transducer, it is preferable that the low-pass filter is a second-order LC low-pass filter.

With this configuration, the low-pass filter provided at the back of the power switching circuit (the output stage or the like of the class-D power amplifier) is regarded as the second-order LC low-pass filter. For this reason, it may remove switching carrier components without consumption of the output power from the power switching circuit (the output stage or the like of the class-D power amplifier). Further, since the negative feedback is performed from the back of the second-order LC low-pass filter, a phase rotational amount of the negative feedback signal may be restricted within 180 degrees. Therefore, it may stably control the negative feedback by suppressing oscillation of the negative feedback circuit.

In addition, according to the above electrostatic transducer, it is preferable that the negative feedback circuit includes a phase compensation circuit.

With this configuration, the phase compensation circuit is provided in the negative feedback circuit. For this reason, it may stably control the negative feedback by expanding a phase margin of the negative feedback.

Further, according to the above electrostatic transducer, it is preferable that an output circuit formed by the low-pass filter, the output transformer, and a load capacitance has two parallel resonance frequencies f1 and f3 and two serial resonance frequencies f2 and f4 (f1<f2<f3<f4), as viewed from an input side. Furthermore, a constant of each circuit element configuring the output circuit may be set so that the first parallel resonance frequency f1 of the resonance frequencies matches or approximately matches a rated driving frequency or a carrier wave frequency fd of the electrostatic transducer.

With this configuration, the circuit constant is set such that the parallel resonance frequency f1 of the load side in which the class-D power amplifier drives matches or approximately matches the rated driving frequency or the carrier wave frequency of the electrostatic transducer.

For this reason, impedance of the load side becomes high in the driving frequency band of the electrostatic transducer, and the output current from the power switching circuit (the output stage or the like of class-D power amplifier) is reduced. Therefore, it is possible to reduce the power loss.

In addition, according to the above electrostatic transducer, it is preferable that an output circuit formed by the low-pass filter, the output transformer, and a load capacitance has two parallel resonance frequencies f1 and f3 and two serial resonance frequencies f2 and f4 (f1<f2<f3<f4), as viewed from an input side. Furthermore, a constant of each circuit element configuring the output circuit may be set so that the first serial resonance frequency f2 of the resonance frequencies matches or approximately matches a cutoff frequency fc in a driving frequency band of the electrostatic transducer.

With this configuration, the circuit constant is set such that the first serial resonance frequency f2 matches or approximately matches the cutoff frequency in the driving frequency band (passing band) of the electrostatic transducer.

For this reason, the passing of the frequency component higher than the driving frequency band (passing band) of the electrostatic transducer is effectively prevented, and thus an output noise becomes small.

In addition, according to the above electrostatic transducer, it is preferable that an output circuit formed by the low-pass filter, the output transformer, and a load capacitance has two parallel resonance frequencies f1 and f3 and two serial resonance frequencies f2 and f4 (f1<f2<f3<f4), as viewed from an input side. Further, a leakage inductance of the output transformer and the other circuit constant may be set so that the second serial resonance frequency f4 of the resonance frequencies is positioned below a modulation frequency band of the modulation circuit.

With this configuration, each circuit constant is set such that the second serial resonance frequency f4 of the resonance frequencies is positioned below the modulation frequency band (switching frequency band (carrier frequency band for modulation) of the power switching circuit) of the modulation circuit.

For this reason, since a damping slope of the low-pass filter increases in the switching frequency band of the power switching circuit (the output stage or the like of the class-D power amplifier), the switching carrier components are sufficiently removed in the power switching circuit output, and thus the output noise becomes small.

In addition, according to the above electrostatic transducer, it is preferable that the electrostatic transducer includes a first electrode that has a plurality of holes, a second electrode that has a plurality of holes making pairs with the holes of the first electrode, and a vibrating film that has a conductive layer and is inserted between a pair of electrodes formed with the first and second electrodes, a direct current bias voltage being applied to the conductive layer, the secondary winding of the output transformer is provided with a center tap, one terminal of the secondary winding of the output transformer is connected to a first electrode of the electrostatic transducer, and the other terminal thereof is connected to a second electrode of the electrostatic transducer, and the direct current bias voltage based on the center tap of the secondary winding of the output transformer is applied to the conductive layer of the vibrating film.

With this configuration, by using the electrostatic transducer of a push pull type shown in FIGS. 11A to 11C as the electrostatic transducer according to the aspect of the invention, one terminal of the secondary winding of the output transformer T is connected to the front fixed electrode (first electrode), and the other terminal thereof is connected to the rear fixed electrode (second electrode), and the direct current bias voltage based on the center tap of the secondary winding of the output transformer T is applied to the conductive layer (vibrating film electrode) of the vibrating film.

For this reason, the electrostatic transducer of the push pull type may be driven with a low loss in a broadband. Particularly, when the electrostatic transducer is used as the ultrasonic speaker, the reproduced sound quality due to the flat output characteristic may be improved.

According to further aspect of the invention, a method of setting a circuit constant includes: amplifying a difference between an external input signal and a negative feedback signal from an output side by an error amplification circuit; pulse-modulating the signal outputted from the error amplification circuit by a modulation circuit; switching between a power supply voltage and a ground potential or between a positive power supply voltage and a negative power supply voltage by a power switching circuit; generating a gate driving signal for switching-controlling a switching element configuring the power switching circuit, from a modulated signal outputted from the modulation circuit by a gate driving circuit; removing switching carrier components included in an output signal of the power switching circuit by a low-pass filter that is connected to an output side of the power switching circuit; performing a negative feedback from the output terminal of the low-pass filter to an input terminal of the error amplification circuit by a negative feedback circuit; boosting an output signal of the low-pass filter by an output transformer in which a primary winding is connected to an output terminal of the low-pass filter and a secondary winding is connected in parallel with the electrostatic transducer serving as a capacitive load; setting an output circuit formed by the low-pass filter, the output transformer, and a load capacitance so as to have two parallel resonance frequencies f1 and f3 and two serial resonance frequencies f2 and f4 (f1<f2<f3<f4), as viewed from an input side; and setting a constant of each circuit element configuring the output circuit is set so that the first parallel resonance frequency f1 of the resonance frequencies matches or approximately matches a rated driving frequency or a carrier wave frequency fd of the electrostatic transducer.

With this procedure, the circuit constant is set such that the parallel resonance frequency f1 of the load side in which the class-D power amplifier drives matches or approximately matches the rated driving frequency or the carrier wave frequency of the electrostatic transducer.

For this reason, impedance of the load side becomes high in the driving frequency band of the electrostatic transducer, and the output current from the power switching circuit (the output stage or the like of class-D power amplifier) is reduced. Therefore, it is possible to reduce the power loss.

According to still further aspect of the invention, an ultrasonic speaker includes: an electrostatic transducer that is driven according to a signal in an ultrasonic frequency band; a modulator that supplied the electrostatic transducer with a modulated signal which is obtained by modulating a carrier wave signal in the ultrasonic frequency band with an acoustic signal in an audible frequency band; the electrostatic transducer that configures the ultrasonic speaker including; In this case, the electrostatic transducer may include an error amplification circuit that amplifies a difference between an external input signal provided to one input terminal and a negative feedback signal provided from the following negative feedback circuit to the other input terminal; a modulation circuit that pulse-modulates the signal outputted from the error amplification circuit; a power switching circuit that switches between a power supply voltage and a ground potential or between a positive power supply voltage and a negative power supply voltage; a gate driving circuit that generates a gate driving signal for switching-controlling a switching element configuring the power switching circuit, from a modulated signal outputted from the modulation circuit; a low-pass filter that is connected to an output side of the power switching circuit and removes switching carrier components included in an output signal of the power switching circuit; a negative feedback circuit that negatively feedbacks from the output terminal of the low-pass filter to an input terminal of the error amplification circuit; and an output transformer that boosts an output signal of the low-pass filter and has a primary winding connected to an output terminal of the low-pass filter. Furthermore, in this case, the electrostatic transducer may be connected in parallel with a secondary winding of the output transformer and driven as a capacitive load.

With this configuration, a carrier wave in the ultrasonic frequency band is modulated by a signal wave in an audible frequency band, and the electrostatic transducer is driven by inputting the modulated signal into the driving circuit (class-D power amplifier) of the negatively feedback controlled electrostatic transducer.

For this reason, the electrostatic transducer is used to the ultrasonic speaker. When the electrostatic transducer is driven by the class-D power amplifier, the ultrasonic speaker may be stably driven with the low loss in a broadband. Accordingly, the reproduced sound quality of the ultrasonic speaker may be improved.

According to still further aspect of the invention, a display device includes: an ultrasonic speaker that reproduces a signal sound in an audible frequency band; the ultrasonic speaker, including: an electrostatic transducer that is driven according to a signal in an ultrasonic frequency band; a modulator that supplies the electrostatic transducer with a modulated signal which is obtained by modulating a carrier wave signal in the ultrasonic frequency band with sound signals supplied from an acoustic sound source; the electrostatic transducer that configures the ultrasonic speaker including;; and a projection optical system that projects image on a projection surface. In this case, the electrostatic transducer configuring the ultrasonic speaker may include an error amplification circuit that amplifies a difference between an external input signal provided to one input terminal and a negative feedback signal provided from the following negative circuit to the other input terminal; a modulation circuit that pulse-modulates the signal outputted from the error amplification circuit; a power switching circuit that switches between a power supply voltage and a ground potential or between a positive power supply voltage and a negative power supply voltage; a gate driving circuit that generates a gate driving signal for switching-controlling a switching element configuring the power switching circuit, from a modulated signal outputted from the modulation circuit; a low-pass filter that is connected to an output side of the power switching circuit and removes switching carrier components included in an output signal of the power switching circuit; a negative feedback circuit that performs a negative feedback from the output terminal of the low-pass filter to an input side of the error amplification circuit; and an output transformer that boosts an output signal of the low-pass filter and has a primary winding connected to an output terminal of the low-pass filter. Furthermore, the electrostatic transducer may be connected in parallel with a secondary winding of the output transformer and driven as a capacitive load.

The ultrasonic speaker configured by the electrostatic transducer according to the aspect of the invention is used in the above display device. The sound signal supplied from the acoustic sound source is reproduced by the ultrasonic speaker.

For this reason, the ultrasonic speaker that can drive with the low loss and has the flat output frequency characteristic may be used in the display device. The acoustic signal having sufficient sound pressure and the broadband characteristic may be reproduced so as to generate from a virtual sound source formed on a sound wave reflecting surface such as a screen. In addition, the reproducing range of the acoustic signal may be easily controlled.

According to still further aspect of the invention, a directional acoustic system includes: an ultrasonic speaker that reproduces a signal sound in a first frequency range of sound signals supplied from an acoustic sound source; a reproduction speaker that reproduces a signal sound in a second frequency range of the sound signals supplied from the acoustic sound source; the ultrasonic speaker, including: an electrostatic transducer that is driven according to a signal in an ultrasonic frequency band; a modulator that supplies the electrostatic transducer with a modulated signal which is obtained by modulating a carrier wave signal in the ultrasonic frequency band with the sound signal in the first frequency range of the sound signals supplied from the acoustic sound source; In this case, the sound signals supplied from an acoustic sound source may be reproduced by the acoustic sound source, and a virtual sound source is formed in the vicinity of a sound wave reflecting surface such as a screen. In addition, the electrostatic transducer configuring the ultrasonic speaker may include an error amplification circuit that amplifies a difference between an external input signal and a negative feedback signal from an output side; a modulation circuit that pulse-modulates the signal outputted from the error amplification circuit; a power switching circuit that switches between a power supply voltage and a ground potential or between a positive power supply voltage and a negative power supply voltage; a gate driving circuit that generates a gate driving signal for switching-controlling a switching element configuring the power switching circuit, from a modulated signal outputted from the modulation circuit; a low-pass filter that is connected to an output side of the power switching circuit and removes switching carrier components included in an output signal of the power switching circuit; a negative feedback circuit that performs a negative feedback from the output terminal of the low-pass filter to an input side of the error amplification circuit; and an output transformer that boosts an output signal of the low-pass filter and has a primary winding connected to an output terminal of the low-pass filter. The electrostatic transducer may be connected in parallel with a secondary winding of the output transformer and driven as a capacitive load.

The ultrasonic speaker configured by the electrostatic transducer according to the aspect of the invention is used in the above directional acoustic system. The sound signal of medium and high frequency sound ranges (first sound range) among the sound signals supplied from the acoustic sound source is reproduced by the ultrasonic speaker. Further, the sound signal of a low frequency sound range (second sound range) among the sound signals supplied from the acoustic sound source is reproduced by the low frequency sound reproducing speaker.

Accordingly, the ultrasonic speaker that can drive with the low loss and has the flat output frequency characteristic may be used in the directional acoustic system. The ultrasonic speaker may be driven by the class-D power amplifier. For this reason, the acoustic signal of the medium and high frequency sound ranges having sufficient sound pressure and the broadband characteristic may be reproduced. In addition, since the acoustic of the low frequency sound range is directly outputted from the low frequency sound reproducing speaker provided in the acoustic system, the low frequency sound range is enhanced. Accordingly, it is possible to produce sound field environments having improved sound presence.

BRIEF DESCRIPTION OF THE DRAWINGS

The invention will be described with reference to the accompanying drawings, wherein like numbers reference like elements.

FIGS. 11A to 11C are views showing an example of a structure of an electrostatic ultrasonic transducer.

DESCRIPTION OF EXEMPLARY EMBODIMENTS

Hereinafter, preferred embodiments according to the invention will be described with reference to the accompanying drawings.

First Embodiment

Figure 1:
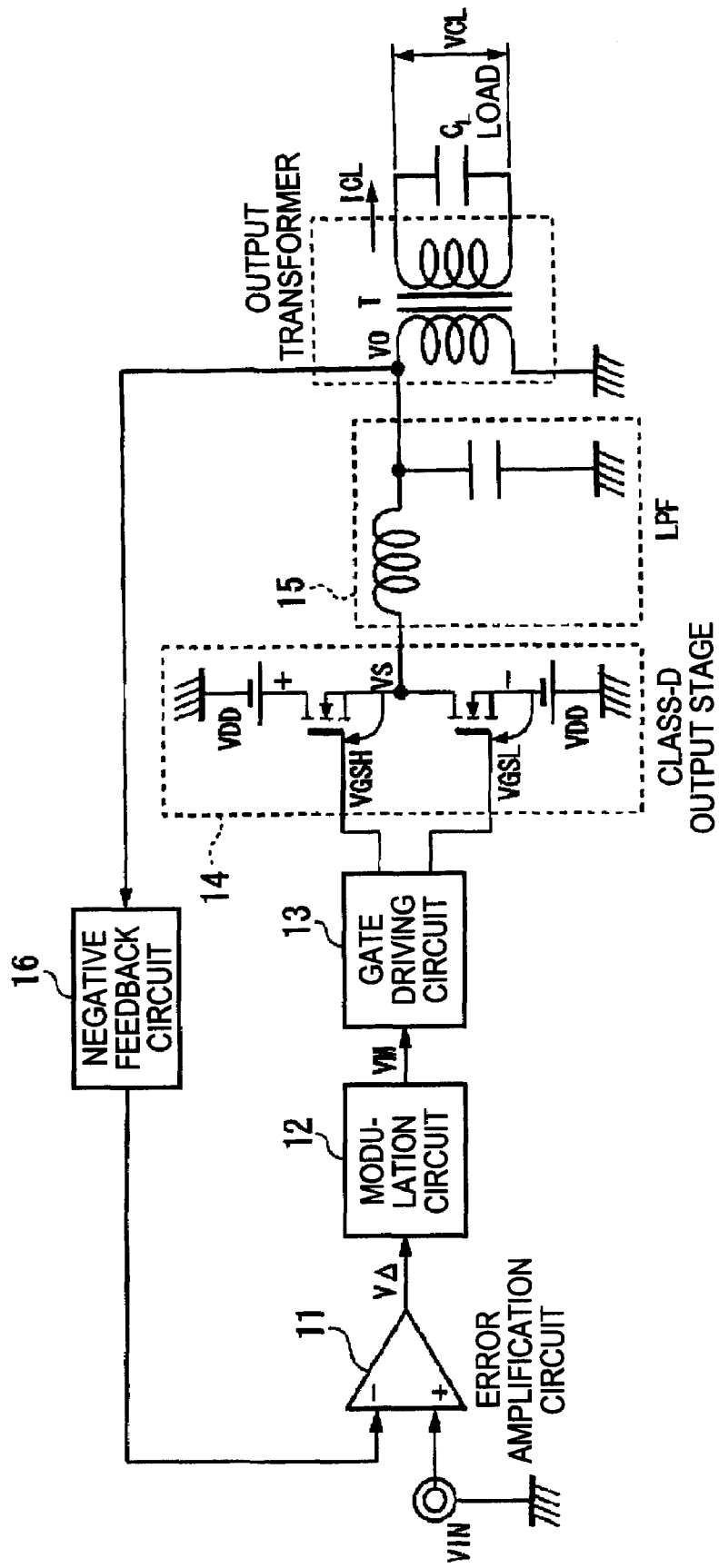
FIG. 1 is a view showing a structure example of a capacitive load driving circuit according to an embodiment of the present invention.
Figure 2:
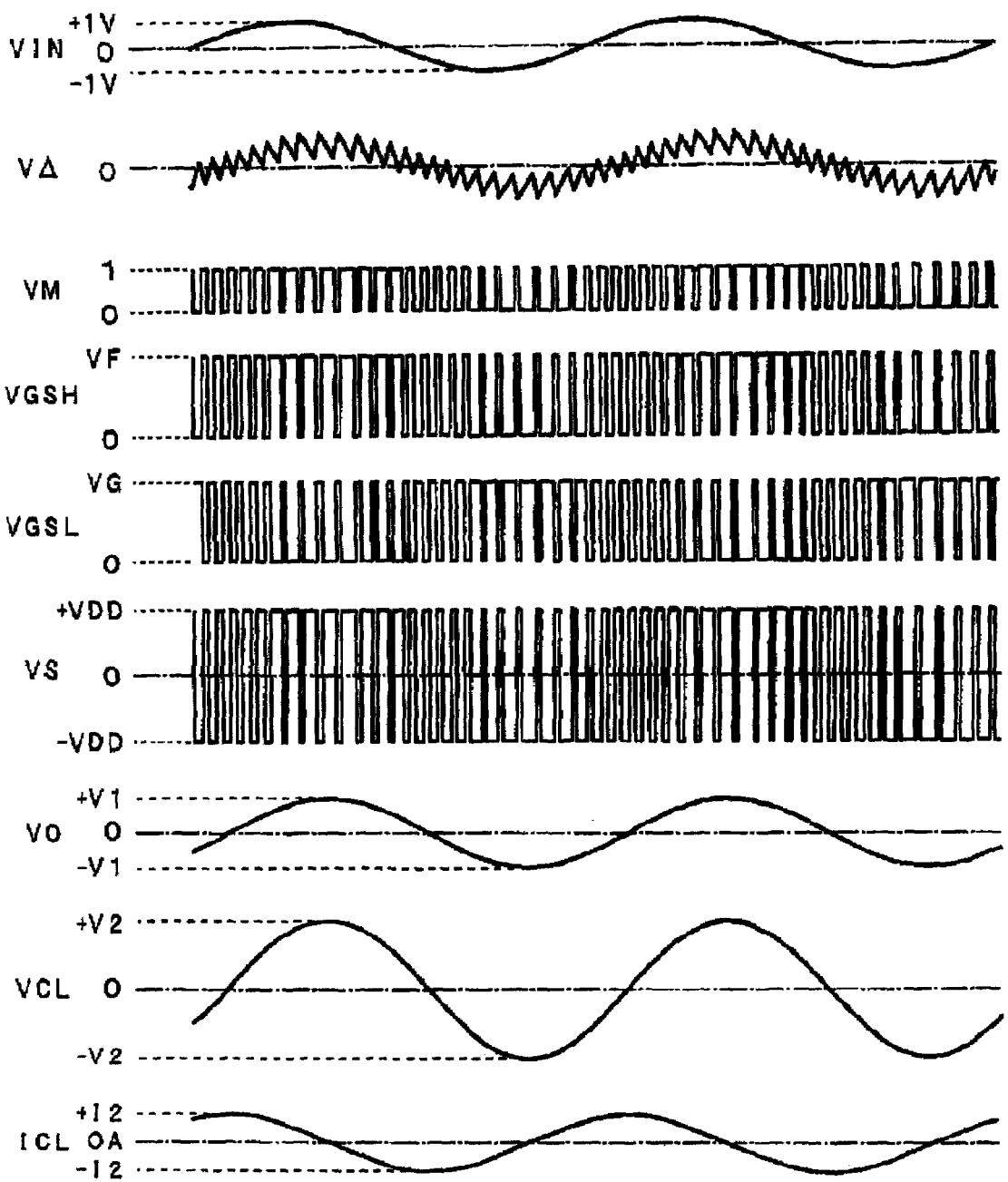
FIG. 2 is a view showing an example of an operation waveform of each part.

FIG. 1 is a view showing a structure example of a capacitive load driving circuit according to an embodiment of the present invention. In addition, FIG. 2 is a view showing an example of an operation waveform of each part.

As shown in FIG. 1, the capacitive load driving circuit 1 according to the embodiment of the present invention includes an error amplification circuit 11, a modulation circuit 12, a gate driving circuit 13, class-D output stage 14, LC low-pass filter (LPF) 15, a negative feedback circuit 16, an output transformer T, and a load capacitance CL as a basic structure element.

The error amplification circuit 11 amplifies a difference between a signal VIN inputted from an outside and a signal from the negative feedback circuit (described later). The external input signal VIN is inputted to a non inverting input terminal (+) of the error amplification circuit 11, and a feedback signal from the negative feedback circuit 16 is inputted to an inverting input terminal (−) of the error amplification circuit 11.

An error signal VΔ amplified in the error amplification circuit 11 is transformed into a modulation signal VM serving as a digital signal by the modulation circuit 12. A PWM (Pulse Width Modulation) modulation or a PDM (Pulse Density Modulation) modulation is used as a modulation method. Amplitude information of an analog signal outputted from the error amplification circuit 11 is modulated into the pulse width of the pulse having a period shorter than the period of the analog signal in the PWM modulation method and modulated into the density of the pulse having the period shorter than the period of the analog signal in the PDM modulation method. In addition, a modulation signal VM shown in FIG. 2 is an example when ΔΣ modulation waveform of the PDM modulation method is performed. Since the modulation circuit 12 uses a circuit structure generally known, the concrete description thereof is omitted.

The modulation signal VM modulated in the modulation circuit 12 is transformed into a gate driving signal capable of driving the class-D output stage 14 by the gate driving circuit 13 and supplied to the class-D output stage 14. The class-D output stage 14 is provided with an upper switching element and a lower switching element by two Nch power MOSFET and switches between positive and negative power supplies in accordance with the gate driving signal outputted from the gate driving circuit.

The gate driving circuit 13 includes a level shift circuit (not shown), a dead time generating circuit (not shown), a lower gate driving signal generating circuit (not shown) and upper gate driving signal generating circuit (not shown), and a floating power supply (not shown). The level shift circuit shifts a level of the modulation signal (PWM signal or PDM signal) VM modulated in the modulation circuit 12 into a level capable of driving the gate of the power MOSFET that configures the class-D output stage 14. The dead time generating circuit each delays ON/OFF driving timings of the upper switching element and the lower switching element of the class-D output stage. The floating power supply is connected to the upper gate driving signal generating circuit. In addition, the gate driving circuit 13 generates a signal for driving the gate of the upper Nch power MOSFET and a signal for driving the gate of the lower Nch power MOSFET that configure the class-D output stage and outputs.

In addition, since the class-D output stage according to the first embodiment is configured so as to use the upper and lower Nch power MOSFETs, the upper gate driving signal is configured such that the plus floating power supply voltage VF is outputted on the basis of a source potential of the upper power MOSFET, that is, an output voltage VS of the class-D output stage. FIG. 2 shows a waveform of a gate—source voltage that is a difference between a gate voltage VGH (not shown) of the upper power MOSFET and the source voltage (class-D output voltage) VS. The upper power MOSFET is ON when the VGSH is VF (when the VGH is VF+VS), and is OFF when the VGSH is zero (when the VGH is VS).

Meanwhile, the lower gate driving signal is configured such that the plus lower gate power supply voltage VG is outputted on the basis of a source potential of the lower power MOSFET, that is, a negative power supply voltage −VDD. FIG. 2 shows the waveform of the gate—source voltage that is the difference between a gate voltage VGL (not shown) of the lower power MOSFET and the negative power supply voltage −VDD. The lower power MOSFET is ON when the VGSL is VG (when the VGL is VG−VDD), and is OFF when the VGSL is zero (when the VG is −VDD).

Since the phase of the upper gate driving signal is inverted to the phase of the lower gate driving signal with 180 degrees, upper and lower gate driving signals are generated such that the upper and lower power MOSFETs are not simultaneously turned-ON. In addition, since the rise (fall) timing of the upper gate driving signal and the fall (rise) timing of the lower gate driving signal are delayed (inserting delay) to match the switching velocity of the power MOSFET by the dead time generating circuit, it is controlled such that the upper and lower power MOSFETs are not simultaneously turned-ON during a switching transition. Further, since the gate driving circuit is realized by the known circuit structure, the concrete description thereof is omitted.

Switching carrier components included in the output voltage VS from the class-D output stage are removed (attenuated) by a second-order LC low-pass filter.

A signal VO passed through the LC low-pass filter is boosted by the output transformer T, and then being applied to the load capacitance CL. At this time, since the filter is formed by even the load capacitance CL and a coil inductance of the output transformer T, the switching carrier components, which are not removed by the LC low-pass filter, are further damped so as to be supplied (VCL, ICL) to the load. At the same time, the signal VO passed through the LC low-pass filter is feed-backed to the inverting input terminal (−) of the error amplification circuit 11 via the negative feedback circuit 16.

FIG. 2 shows an operation waveform of each part in the driving circuit shown in FIG. 1, wherein VIN indicates a voltage waveform of the external input signal toward the driving circuit, VΔ indicates an output voltage waveform from the error amplification circuit, VM indicates a ΔΣ modulation signal voltage waveform (represented by logical level), VGSH indicates an upper power MOSFET gate—source voltage waveform, VGSL indicates a lower power MOSFET gate—source voltage waveform, VS indicates an output voltage waveform of the class-D output stage, VO indicates LC low-pass filter output voltage waveform (a primary side voltage waveform of the output transformer), VCL indicates a terminal voltage waveform of the load capacitance CL, and ICL indicates a current waveform of the load capacitance CL.

Hereinafter, a method of setting a circuit constant according to an embodiment of the driving circuit of the invention will be described.

First, the constant of the output circuit next to the LC low-pass filter is decided.

Figure 3:
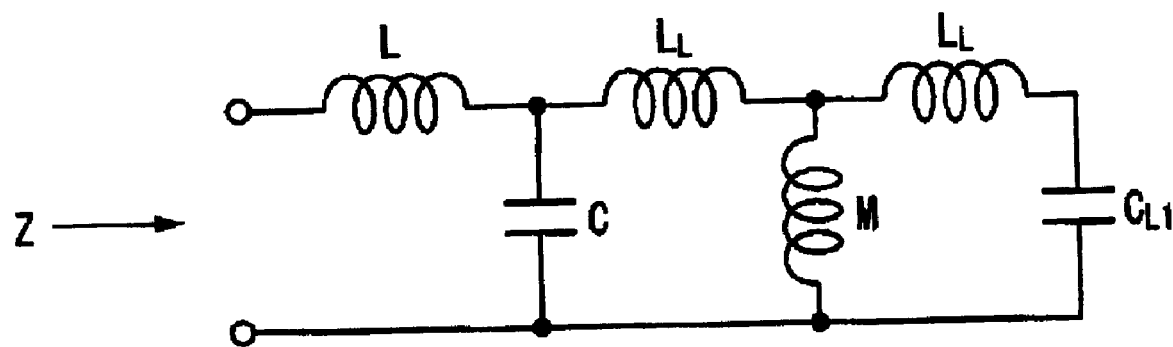
FIG. 3 is a view showing an equivalent circuit of an output circuit.

FIG. 3 is a view showing an equivalent circuit of an output circuit. Assuming that CL1 is a value in which the load capacitance CL is converted into the primary side of the output transformer T, a leakage inductance LL is an inductance of the primary winding when the secondary winding of the output transformer T is shorted, and M is a mutual inductance of the output transformer T, the equivalent circuit of the output circuit next to the LC low-pass filter is shown as FIG. 3. In addition, since resistance component is sufficiently small, it is neglected herein.

Assuming that an angular frequency is ω, an impedance Z as viewed from the input side of the equivalent circuit of FIG. 3 is as a follow.

$$Z = \frac{A_n \omega^4 + B_n \omega^2 + C_n}{A_d \omega^4 + B_d \omega^2 + C_d} \quad \text{Equation 1}$$

$$A_n = (2M + L_L)LL_L CC_{L1} \quad \text{Equation 2}$$
$$B_n = -\{(M + L_L)(C + C_{L1}) + (2M + L_L)L_L C_{L1}\}$$
$$C_n = L + M + L_L$$
$$A_d = (2M + L_L)L_L CC_{L1}$$
$$B_d = -(C + C_{L1})(M + L_L)$$
$$C_d = 1$$

Assuming that a self-inductance of the primary winding of the output transformer T is L1, and a coupling coefficient of the primary winding and the secondary winding of the output transformer T is k, the relationship of "M=L1−LL=kL1" is satisfied. In addition, the four roots of Z indicated in the Equation 1 exist.

The root of a denominator shows as follows.

$$\omega_1 = \sqrt{\frac{-B_d - \sqrt{B_d^2 - 4A_d C_d}}{2A_d}}, \quad \text{Equation 3}$$

$$\omega_3 = \sqrt{\frac{-B_d + \sqrt{B_d^2 - 4A_d C_d}}{2A_d}},$$

The root of the denominator is a pole of the equivalent circuit in FIG. 3 and indicates the parallel resonance angular frequency (that is, anti-resonance angular frequency).

The root of a numerator shows as follows.

$$\omega_2 = \sqrt{\frac{-B_n - \sqrt{B_n^2 - 4A_n C_n}}{2A_n}}, \quad \text{Equation 4}$$

$$\omega_4 = \sqrt{\frac{-B_n + \sqrt{B_n^2 - 4A_n C_n}}{2A_n}},$$

The root of the nominator is a zero point of the equivalent circuit in FIG. 3 and indicates the serial resonance angular frequency.

For example, when each circuit constant of the output circuit is, L=10 µH, C=0.47 µF, L1=20 µH, LL=0.4 µH, and CL1=1 µF, the respective resonance frequencies f1 to f4 is represented as follows from the above equations. That is, f1=29.4 kHz, f2=50.1 kHz, f3=315 kHz, and f4=321 kHz.

Figure 4A:
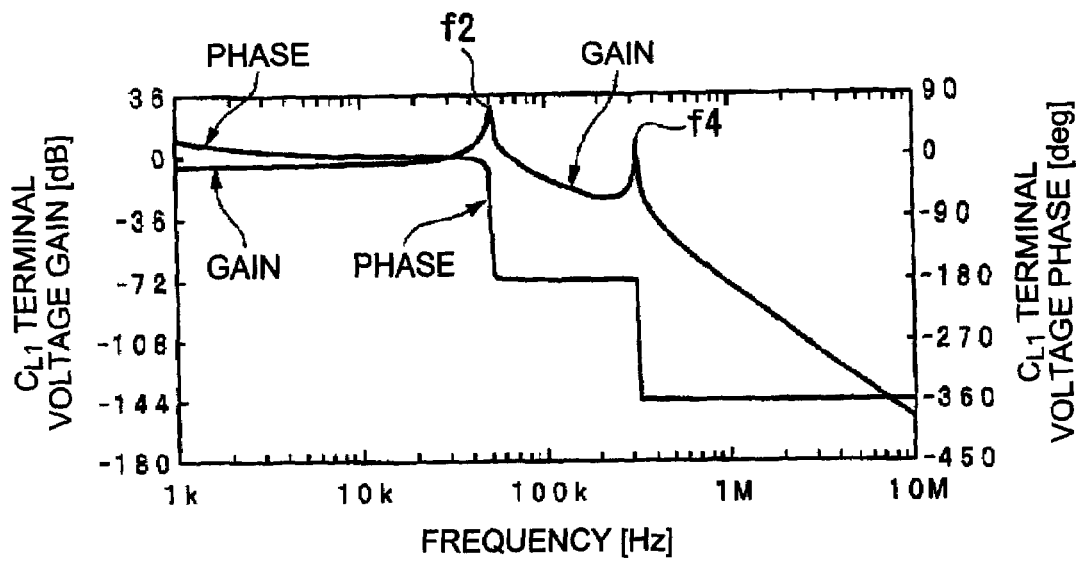
FIGS. 4A and 4B are views showing a gain frequency characteristic curve of the circuit shown in FIG. 3.
Figure 4B:
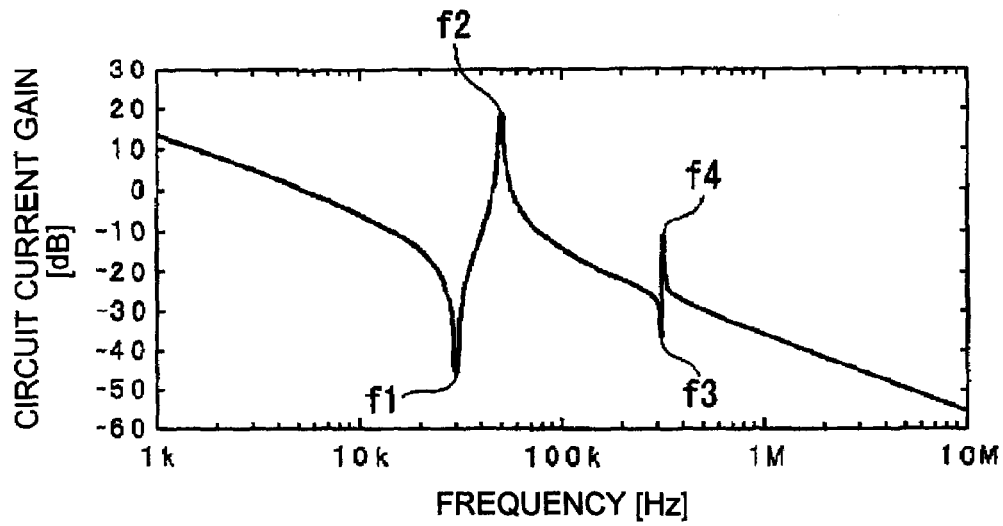

FIGS. 4A and 4B show gain frequency characteristic curves of the circuit shown in FIG. 3 when the signal is supplied from a constant-voltage source (output impedance 0.1 Ω), and as shown in FIG. 4B, the circuit current (output current of the constant-voltage source) has a minimum value in the parallel resonance frequencies f1 and f3, and has a maximum value in the serial resonance frequencies f2 and f4.

The constant of each element of the output circuit is set such that the rated driving frequency or the carrier wave frequency of the capacitive load is approximately equal to the parallel resonance frequency f1. Therefore, in the rated driving frequency, the current flowing toward the primary winding of the transformer may be restrained, thus reducing the loss.

In addition, as shown in FIG. 4A, the voltage of the load capacitance CL1 is damped with a slope of 12 dB/octave from the frequency f2 to the frequency f3, and is damped with a slope of 24 dB/octave from the frequency f4 to a high range. According to the embodiment of the invention, the switching frequency of the class-D output stage is set to the higher frequency range than the serial resonance frequency f4. For this reason, the improved damping efficient may be obtained in the switching frequency band, thus reducing a high frequency distortion.

However, since the resistance component does not exist (or, very small as can be neglected) in the circuit shown in FIG. 3, the sharp peak exists in the frequency characteristic of the gain, as shown in FIGS. 4A and 4B, and the flat passing characteristic is not obtained. Accordingly, the circuit shown in FIG. 3 does not satisfy the performance as the amplifier in which the flat passing characteristic is required. For this reason, generally, the load resistance is connected so as to have the damper characteristic, thus causing the frequency characteristic to be flat.

Figure 5:
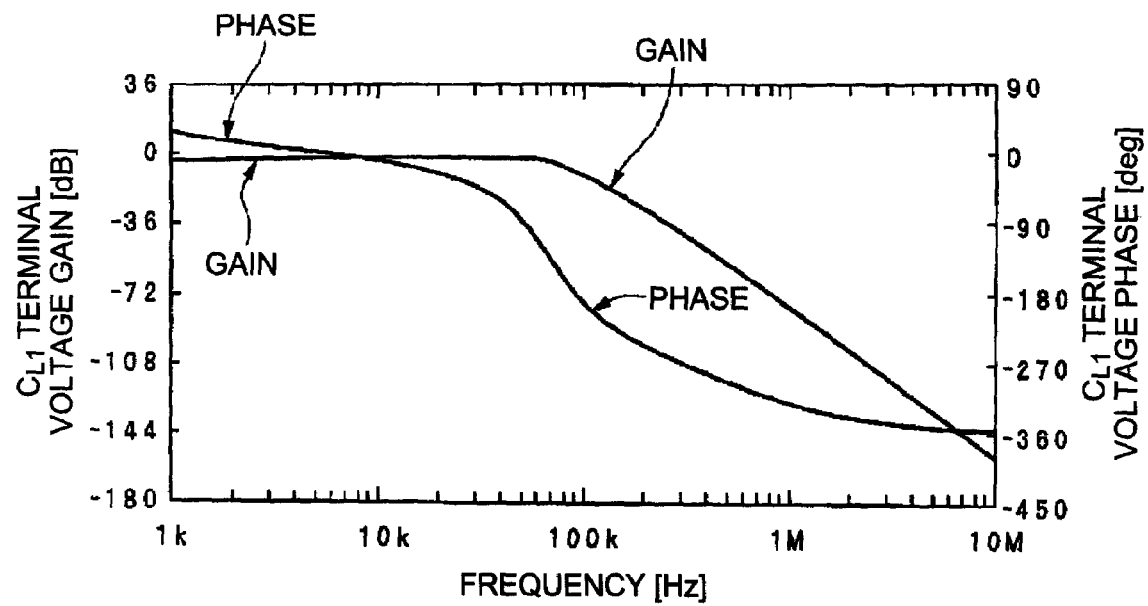
FIG. 5 is a view showing a gain—phase characteristic when resistance of 4 Ω is connected in series with CL1.

FIG. 5 shows a gain—phase characteristic when resistance of 4 Ω is connected in series with CL1. It may obtain the flat passing characteristic without the peak by connecting the load resistance. In the general audio amplifier, the loud speaker serves as the driving load and has the resistance component of about number of Ω. Since the load has a strong damper characteristic by the resistance component, the flat passing characteristic is realized.

Meanwhile, according to the embodiment of the invention, the electrostatic capacitance CL1 is driven, the serial resistance component is very small. The passing characteristic is flattened by connecting the resistance, but the power loss is generated by the resistance. Particularly, as the load capacitance increases or as the driving frequency becomes higher, the load impedance is reduced. Therefore, a larger current flows in the load. For this reason, the power loss in the resistance is very increased, and the efficiency is remarkably reduced. The capacitive load like the electrostatic transducer has the characteristic in which the loss of the device itself is very small. However, as described above, if the load resistance is connected, the characteristic disappears. Therefore, the capacitive load is not preferable.

In order to solve the above-described problems, in the embodiment of the invention, the negative feedback control is performed without the connection of the large serial load resistance so as to realize the flat passing characteristic with low loss. For this reason, the output circuit is configured that the negative feedback from the rear stage of the LC low-pass filter is performed.

With respect to the above output circuit, the phase is rotated with 180 degrees by the second-order LC low-pass filter, and the phase is further rotated with 180 degrees by the load capacitance CL1 and the output transformer T. Since the negative feedback is stably performed, a phase rotational amount in the output circuit is restricted within 180 degrees by performing the negative feedback from the back of the second-order LC low-pass filter, that is, the front of the output transformer T. Since a phase margin is very small in this state, the phase compensation (phase-lead) circuit may be added to the negative feedback circuit, thus expanding the phase margin. Therefore, it may stably control the negative feedback.

Figure 6:
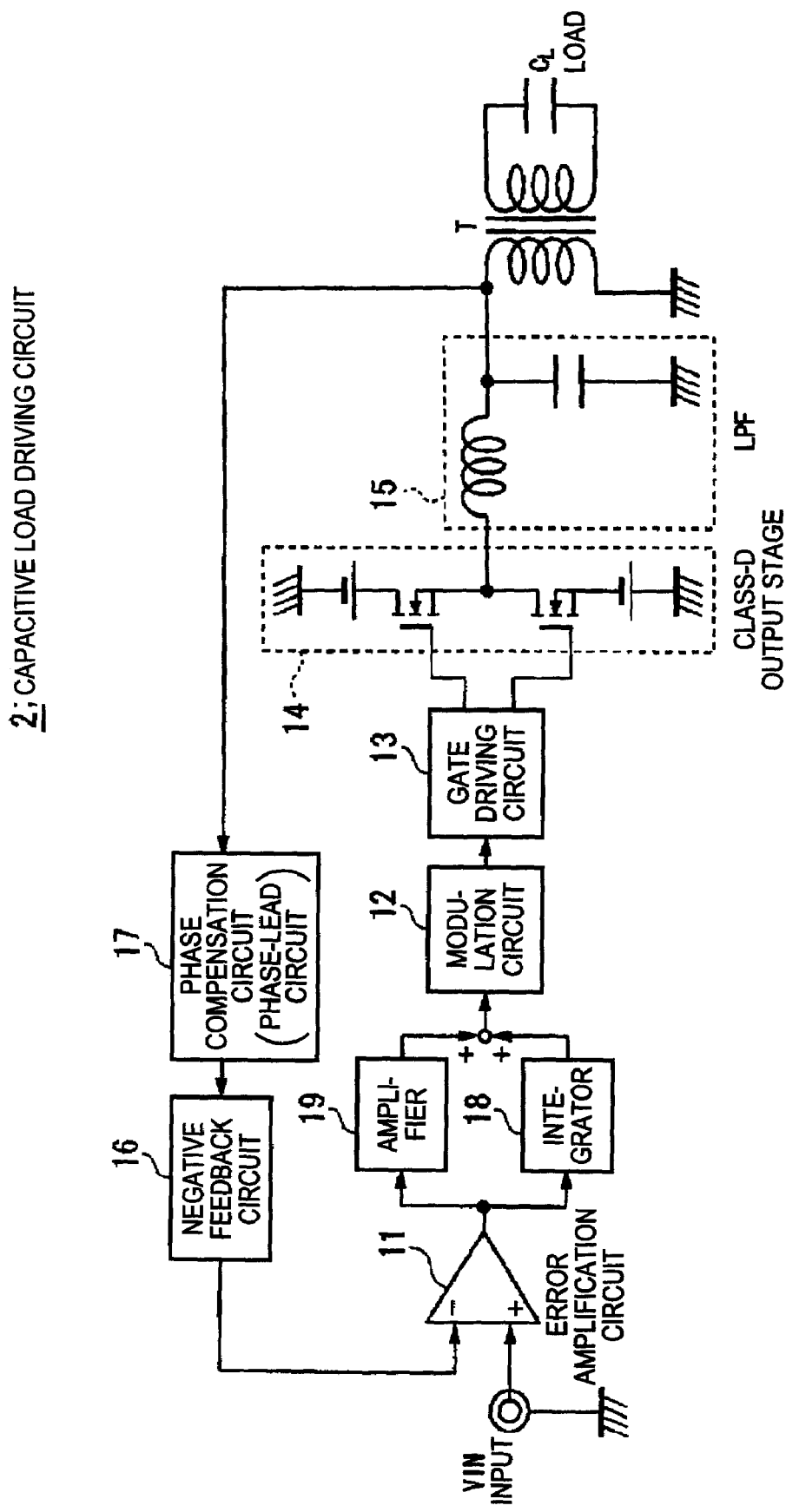
FIG. 6 is a view showing a concrete structure example of the capacitive load driving circuit according to an embodiment of the invention.

FIG. 6 is a view showing a concrete structure example of the capacitive load driving circuit according to the embodiment of the invention, and shows a structure block diagram in which the phase is compensated. Further, FIG. 7 shows an example a constant setting and a circuit structure of the capacitive load driving circuit according to the embodiment of the invention.

PI (proportional integral) control system includes an integrator 18 next to the error amplification circuit 11 shown in FIG. 6 and an amplifier 19. The integrator 18 suppresses DC offset (steady-state deviation) generated by the output. The proportional integral circuit 11A configured by the error amplification circuit 11, the integrator 18, and the amplifier 19 performs the error amplification in actual circuit, for example, as shown in FIG. 7. In addition, and the proportional integral circuit 11A is configured by an operational amplifier and the resistances 4.7 kΩ and 220 kΩ for a proportional gain, the resistance 22 kΩ and a capacitor 0.1 µF for conducting the integral. The negative feedback circuit 16 and the compensation circuit 17 are configured by RC parallel circuit 16a, as shown in FIG. 7.

Figure 7:
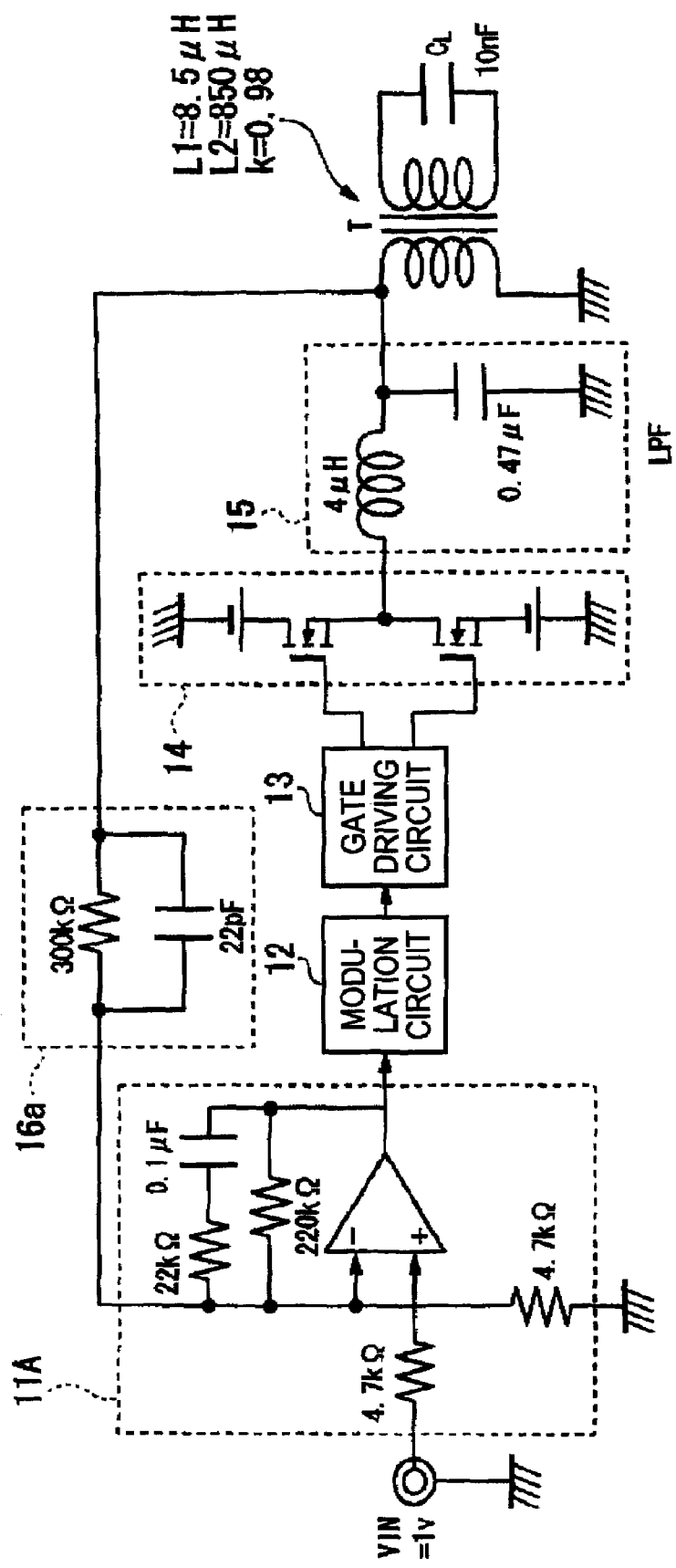
FIG. 7 is a view showing an example a constant setting and a circuit structure of the capacitive load driving circuit according to an embodiment of the invention.

FIG. 7 shows an example of the circuit constant when a total capacitance of the electrostatic transducer (load capacitance CL) is 10 nF and the load driving voltage (output voltage) is 250V and the driving frequency band (output frequency band) is 40 kHz to 80 kHz. The switching frequency of the class-D output stage is considered as about 1 MHz.

When the resonance frequency of the resonance circuit formed by the load capacitance of 10 nF and the self-inductance L2 of the secondary winding of the transformer is a center frequency of 60 kHz in the driving frequency band, the value of L2 is about 850 µH.

The voltage gain for obtaining the output of 250 V during the signal input of 1V is 48 dB. If the voltage gain of 48 dB is distributed into a pre-drive stage of 8 dB, class-D output stage of 20 dB, and the transformer of 20 dB, the self-inductance of the primary winding of the transformer becomes 8.5 µH.

The constant L and C of the LC low-pass filter and the coupling coefficient k of the transformer is set by using the equations of the output circuit such that the resonance frequency f2 of the output circuit approximately matches the cutoff frequency of 80 kHz and the frequencies f3 and f4 become smaller than 1 MHz.

When the value of L, C, and k is given by, L=4 µH, C=0.47 µF, and k=0.98, the frequencies f1, f2, f3, and f4 are obtained by, f1=45.2 kHz, f2=78.4 kHz, f3=483 kHz, and f4=493 kHz.

Figure 8:
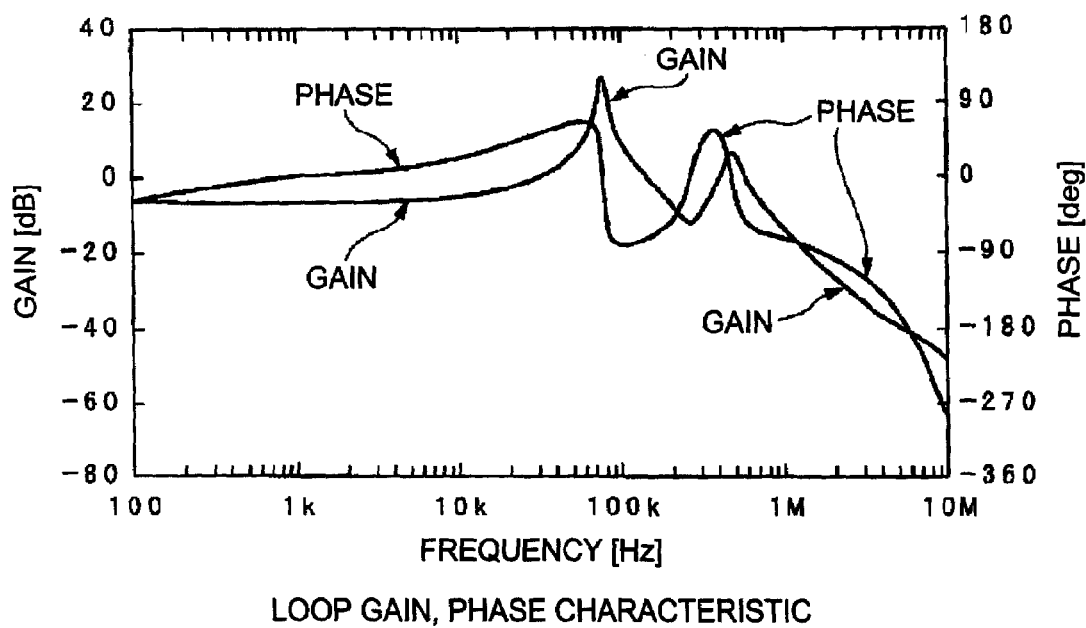
FIG. 8 is a view showing a loop and a phase characteristic of the circuit shown in FIG. 7.
Figure 9:
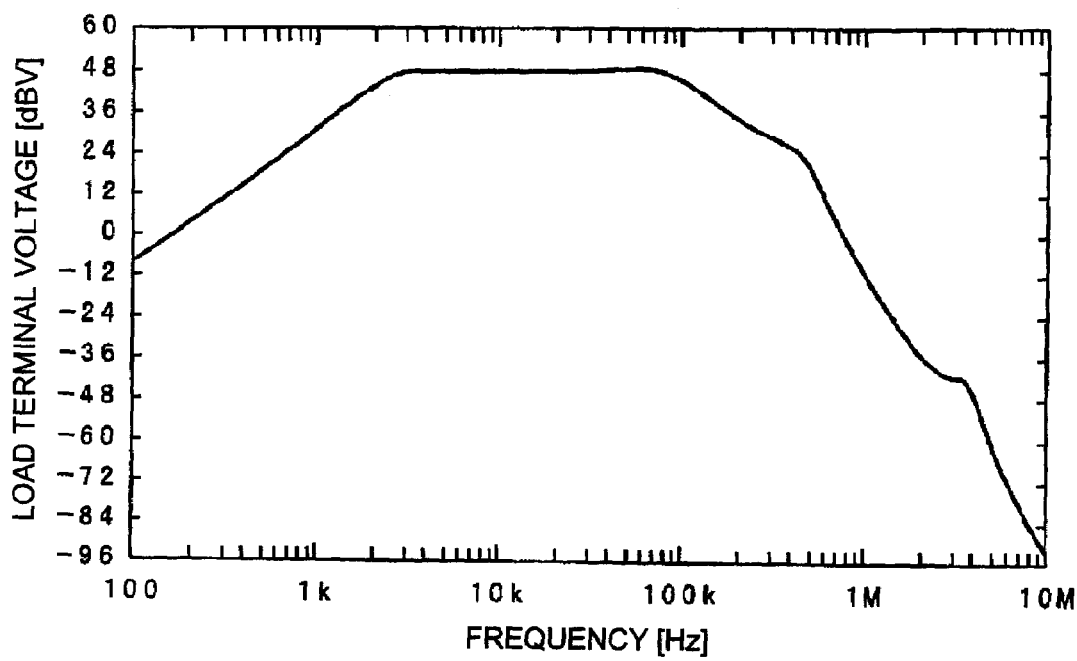
FIG. 9 is a view showing a frequency characteristic of a load terminal voltage (output voltage) of the circuit shown in FIG. 7.

In the above output circuit, if the gain of the error amplifier and the negative feedback gain and the phase compensation capacitance are set as shown in FIG. 7, a loop gain and phase characteristic shown in FIG. 8 may be obtained, and a closed loop characteristic shown in FIG. 9 may be obtained.

Figure 10:
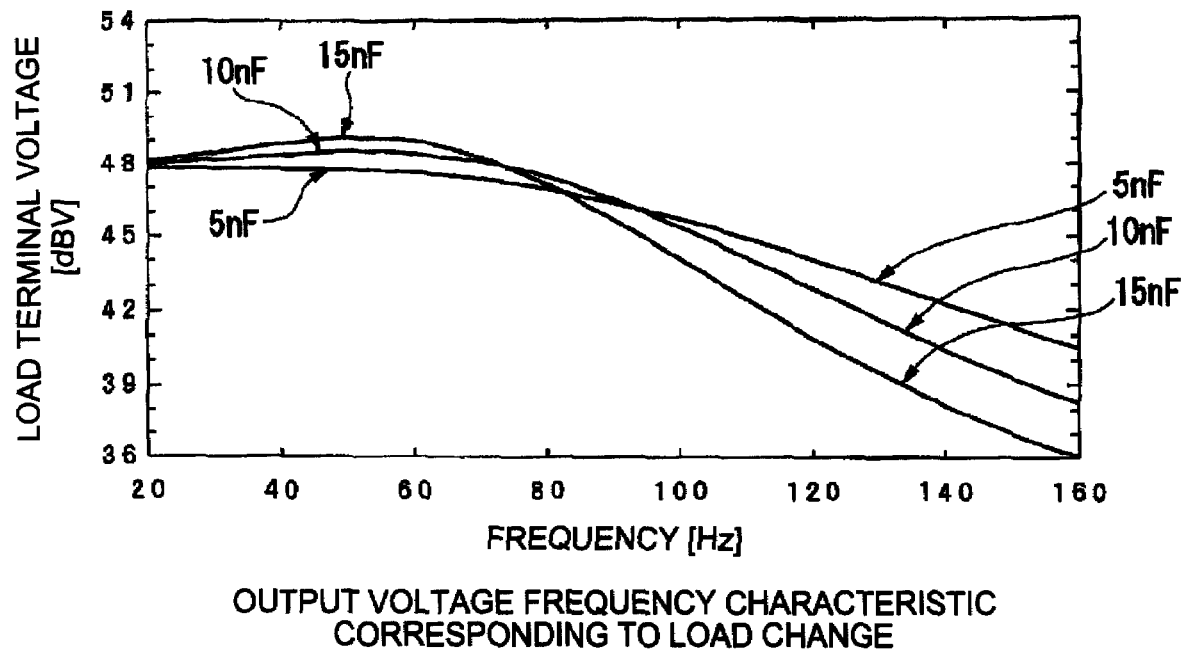
FIG. 10 is a view showing an output voltage frequency characteristic depending on a load variation.

As shown in FIG. 8, since the phase margin and gain margin are sufficiently ensured, the stable negative feedback characteristic may be obtained. Since the negative feedback loop is extracted from the rear stage of the second-order LC low-pass filter, the negative feedback loop is influenced by the impedance of the LC low-pass filter and the resonance circuit next to the LC low-pass filter. Therefore, the sharp peak exists in the loop gain characteristic. In the case where the negative feedback is not performed or the negative feedback is performed from the front the LC low-pass filter like the general class-D amplifier for audio, if the load resistance is not connected, the sharp resonance characteristic directly appears in the output voltage characteristic. However, according to the embodiment of the invention, since the negative feedback is performed by using the resonance characteristic, the loop gain, that is, a damping force is further increased at the resonance peak. The damping force acts in the direction for counteracting the resonance peak. Accordingly, as shown in FIG. 9, the peak does not exist in the closed loop characteristic, and the flat output characteristic may be obtained without the load resistance. In addition, as shown in FIG. 10, even when the load capacitance is largely changed (5 nF to 15 nF), the output characteristic is not largely changed. Therefore, it is possible to stably realize the flat output characteristic despite of the large change of the load.

Since the LC low-pass filter is formed at the even secondary side of the transformer by the inductance component of the output transformer T and the load capacitance component of the output transformer T, the switching carrier components are more removed than the structure where the only second-order LC low-pass filter is formed. In FIG. 9, the damping performance of about −10 dB is obtained at 1 MHz.

In addition, it is possible to set so as to reduce the value of the resonance frequencies f3 and f4 by increasing the leakage inductance LL of the output transformer T (reducing the coupling coefficient).

If the leakage inductance of the output transformer T increases, the change of the output frequency characteristic with respect to the change of the load capacitance increases. However, at this time, the position of the resonance frequencies f3 and f4 is further moved toward the low frequency band, it may further reduce the gain (further increase the damping) in the switching frequency band. Therefore, it is possible to further reduce the output harmonic distortion by increasing the removal performance of the switching carrier. If the removal performance of the switching carrier components is the same, since the lower switching frequency may be set, the switching loss in the output stage element is more reduced, thus configuring the circuit having the higher efficiency.

As described above, the capacitive load driving circuit is suitable for using as the driving circuit of the ultrasonic speaker using the electrostatic transducer. The ultrasonic speaker may reproduce the sound having fine directivity by outputting the modulation wave, of which the carrier wave in the ultrasonic frequency band is modulated by the acoustic signal in the audible frequency band.

Since the electrostatic transducer has the sound pressure—frequency characteristic of relatively broad band, if the electrostatic transducer is used as a transducer of the ultrasonic speaker, it is possible to improve the reproduced sound quality as compared to the piezoelectric transducer of narrow band.

FIGS. 11A to 11C show examples of a structure of an electrostatic ultrasonic transducer suitable for using as the ultrasonic speaker.

FIG. 11A shows the cross-section of the electrostatic ultrasonic transducer 3. In FIG. 11A, the electrostatic ultrasonic transducer 3 includes a vibrating film 22 having a conductive layer (vibrating film electrode) 22A and a pair of fixed electrodes (referred to as the fixed electrode 20 in case of indicating both the front-side fixed electrode 20A and the rear-side fixed electrode 20B) formed with a front-side fixed electrode (first electrode) 20A and a rear-side fixed electrode (second electrode) 20B that are provided at the respective surfaces of the vibrating film 22 so as to face each other. The vibrating film 22, as shown in FIG. 11A, may be formed by sandwiching the conductive layer (vibrating film electrode) 22A that forms an electrode between insulating films 22B or the entire vibrating film 22 may be formed by a conductive material.

In addition, plural through holes 24A are provided at the front-side fixed electrode 20A that sandwiches the vibrating film, and plural through holes 24B having the same shapes are provided at the rear-side fixed electrode 20B in positions facing the respective through holes 24A provided in the front-side fixed electrode 20A (referred to as through holes 24 in case of indicating both the through holes 24A and the through holes 24B). The front-side fixed electrode 20A and the rear-side fixed electrode 20B are supported by a supporting member 21 so as to be separated from the vibrating film 22 with a predetermined gap. As shown in FIG. 11A, the supporting member is formed such that the vibrating film 22 and the fixed electrode 20 face each other by means of a part of gaps. FIG. 11B shows a one-side plane appearance of the electrostatic ultrasonic transducer 3 (the state in which a portion of the fixed electrode 20 is cutout), and the plurality of through holes 24 is disposed in a honeycomb shape. FIG. 11C is a plan view the fixed electrode in which the supporting member is joined, and shows the fixed electrode as viewed from the vibrating film side of the transducer. The supporting member 21 is formed of an insulating material. For example, the supporting member 21 may be formed by pattern-printing the insulating material on the surface (side facing the vibrating film) of the fixed electrode 20, that is, by resist-printing on a print substrate.

With this configuration, alternating current signals 28A, 28B having phase-inverted from each other and the same amplitude are applied to the front-side fixed electrode 20A and the rear-side fixed electrode 20B of the electrostatic ultrasonic transducer. In addition, a direct current bias voltage is applied to the vibrating electrode film 22A by the direct current power supply 26. By applying the direct current bias voltage to the vibrating electrode film 22A and by applying the driving signals (alternating current signals), phase-inverted from each other to the front-side fixed electrode 20A and the rear-side fixed electrode 20B in this manner, an electrostatic attraction force and an electrostatic repulsion force simultaneously act on the vibrating film 22 in the same direction. In addition, the vibrating film 22 is push-pull driven at each time when the polarity of the driving signals (alternating current signals) is reversed so as to change the directions in which the electrostatic attraction force and the electrostatic repulsion force are acted. As a result, the sound wave generated by the vibrating film is emitted to the outside through the through holes 24 provided at the front-side fixed electrode 20A and the rear-side fixed electrode 20B.

Figure 12:
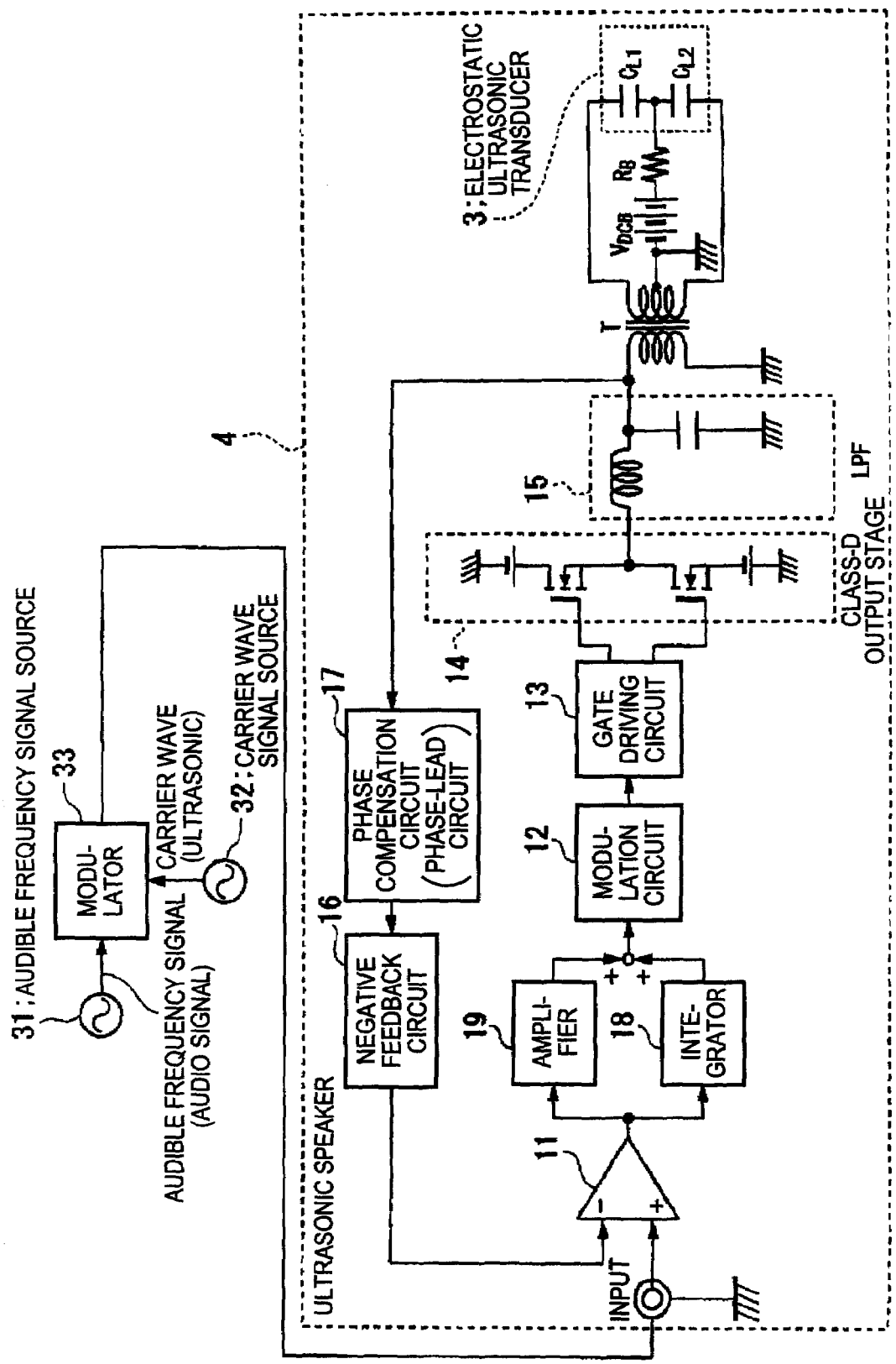
FIG. 12 is a view showing a structure example of an ultrasonic speaker.

FIG. 12 is a view showing a structure example of a driving circuit of an ultrasonic speaker using an electrostatic ultrasonic transducer. Referring to FIG. 12, an audible frequency wave signal source 31 (an audio signal source) generating a signal wave in an audible frequency band, a carrier wave signal source 32 generating and outputting a carrier wave in an ultrasonic frequency band, and a modulator 33 are provided. The carrier wave in the ultrasonic frequency band is outputted from the carrier wave signal source 32 and modulated by the modulator 33. The modulated signal is inputted to the ultrasonic speaker 4 as an input signal.

The carrier wave signal in the ultrasonic band is AM modulated by the audio signal (signal in an audible range), and the ultrasonic speaker 4 emits the modulated signal modulated by AM modulation into the air. When the modulated signal is emitted into the air, the original audio signal is reproduced by itself in the air due to a nonlinear characteristic of the air. That is, since a sound wave is a longitudinal wave that is propagated by the medium of the air and since the sparse portion and dense portion are significantly presented in the air, the speed of sound gets fast in the sparse portion of the air and gets slow in the dense portion of the air in the process of propagating of the modulated ultrasonic wave. Accordingly, the modulated wave is distorted such that the carrier wave (the ultrasonic wave) and the audible wave (the original audio signal) are separated by waveform, and thereby a person can hear only the audible sound (the original audio signal) of 20 kHz or less. This principle is generally called as a parametric array effect.

The ultrasonic speaker 4 shown in FIG. 12, unlike in the circuit configuration shown in FIG. 6, is configured such that the center tap is provided to the secondary winding of the output transformer T and that the direct current bias voltage is applied to the vibrating membrane electrode of the electrostatic ultrasonic transducer 3 on the base of the center tap. As shown in FIG. 12, the electrostatic ultrasonic transducer 3 shown in FIGS. 11A to 11C may be presented as an equivalent circuit where two electrostatic capacitances CL1 and CL2 are connected in series. The connection point in series corresponds to the vibrating membrane electrode 22A (FIG. 11).

Since the output transformer T and the electrostatic ultrasonic transducer 3 are connected to each other as shown in FIG. 12, alternating voltages that have same amplitude and inverted phases with each other are applied to both fixed electrodes, and thereby the sound wave with less distortion may be outputted.

As described above, in the exemplary embodiment of the present invention, the LC low-pass filter, the output filter having the output transformer and the load capacitance, and the class-D amplifier are combined, and the negative feedback is performed from the rear stage of the LC low-pass filter. Accordingly, a flat output frequency characteristic may be realized without the connection of the load resistance (damper resistance). In addition, a loss due to the load resistance and a loss due to the output stage element of the power amplifier may be reduced at the same time, and the entire circuit including the load may be driven with abundantly high efficiency.

In addition, since the negative feedback is performed between the rear side of the LC low-pass filter and the front side of the output transformer, a flat output frequency characteristic (pass characteristic) where a deviation is small may be stably realized when the electrostatic capacitance of the load is varied. Accordingly, the electrostatic transducer extending over a broadband can be stably driven. In particular, when the electrostatic transducer circuit according to the exemplary embodiment of the present invention is used as an ultrasonic speaker, the quality of the reproduced sound can be enhanced due to the flat output characteristic.

Second Embodiment

The second exemplary embodiment of the present invention is explained below.

Figure 13:
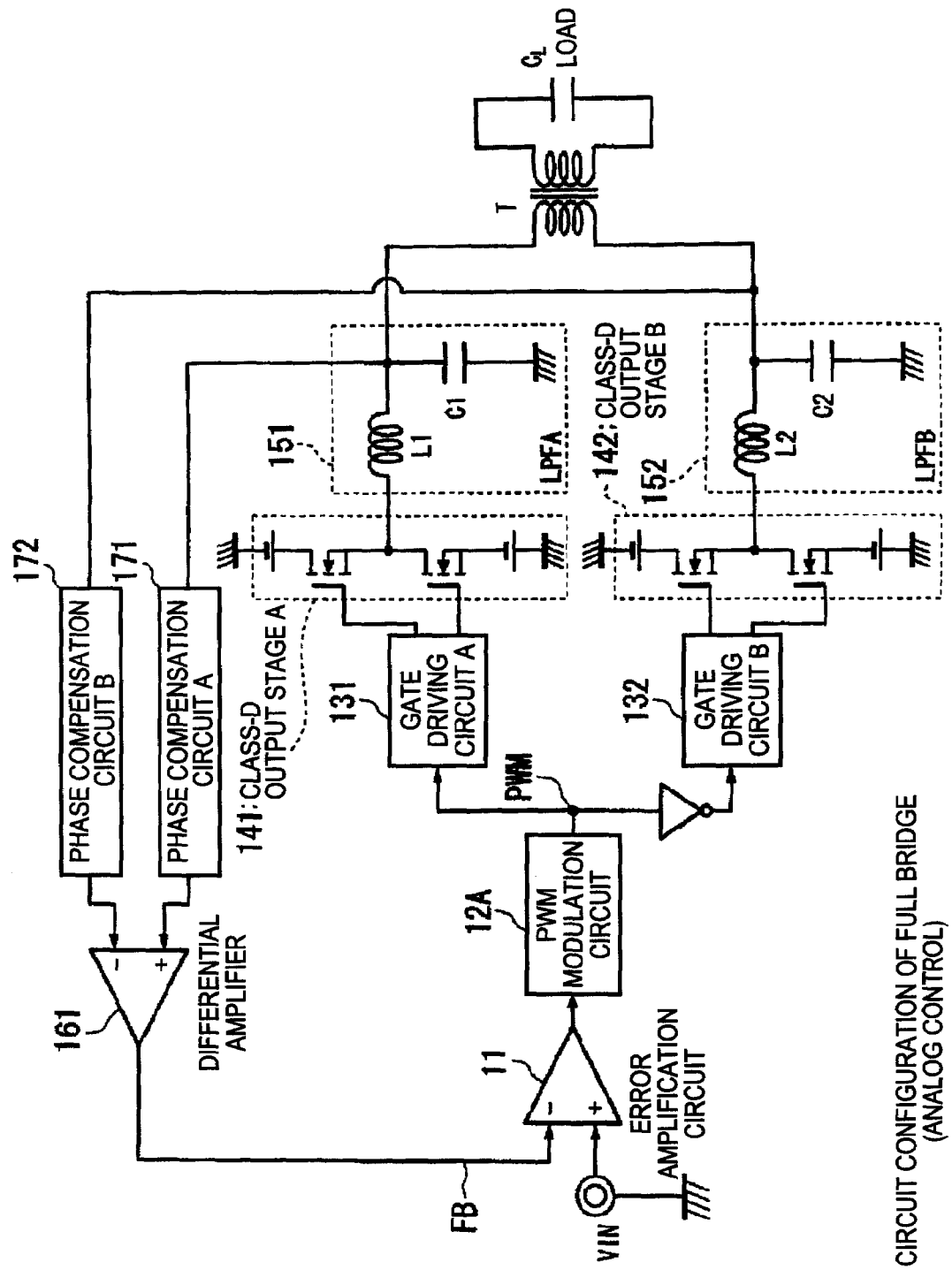
FIG. 13 is a view showing a circuit structure example of a full-bridge by an analog control.

FIG. 13 is a view showing a circuit structure example of a full-bridge driven in a balance output using a pair of gate driving circuits, class-D output stages, and LC filters.

PWM signals supplied to the gate driving circuit A 131 and the gate driving circuit B 132 from the PWM modulation circuit 12A are inverted in phase with each other. Therefore, the class-D output stage A141 and the class-D output stage B142 perform a switching operation in an inverted phase state with each other. The output that is obtained from the LPFA 151 and LPFB 152 of the LC low-pass filter is a balance output.

A phase compensation circuit A 171 and a phase compensation circuit B 172 perform phase lead compensations with respect to each output of the LPFA 151 and LPFB 152. At this time, a voltage is damped to an input level of the differential amplifier 161. Then, it is configured such that a voltage difference between both phase compensation circuits is amplified by the differential amplifier 161 and is inputted to the inverted input terminal of the error amplification circuit 11.

When a circuit parameter is set up, inductance components L1 and L2 of the LPFA 151 and LPFB 152 are combined in series and capacitance components C1 and C2 of the LPFA 151 and LPFB 152 are combined in parallel. Therefore, the circuit parameter can be calculated using the equivalent circuit shown in FIG. 3.

With the full-bridge configuration as described above, a large output may be obtained although the parts count constituting the driving circuit is increased. In addition, the ratui of PWM modulation which is necessary to generate the output same as the output in a half-bridge configuration may be lowered. Therefore, a margin can be obtained in AC characteristic of circuit elements and in gain design of driving circuits, and the output frequency characteristic can be easily extended into a high frequency range. In addition, since the output circuit system and the feedback circuit system are operated in balance, it can be made difficult to be influenced by common mode noise.

Third Embodiment

The third exemplary embodiment of the present invention is explained below.

Figure 14:
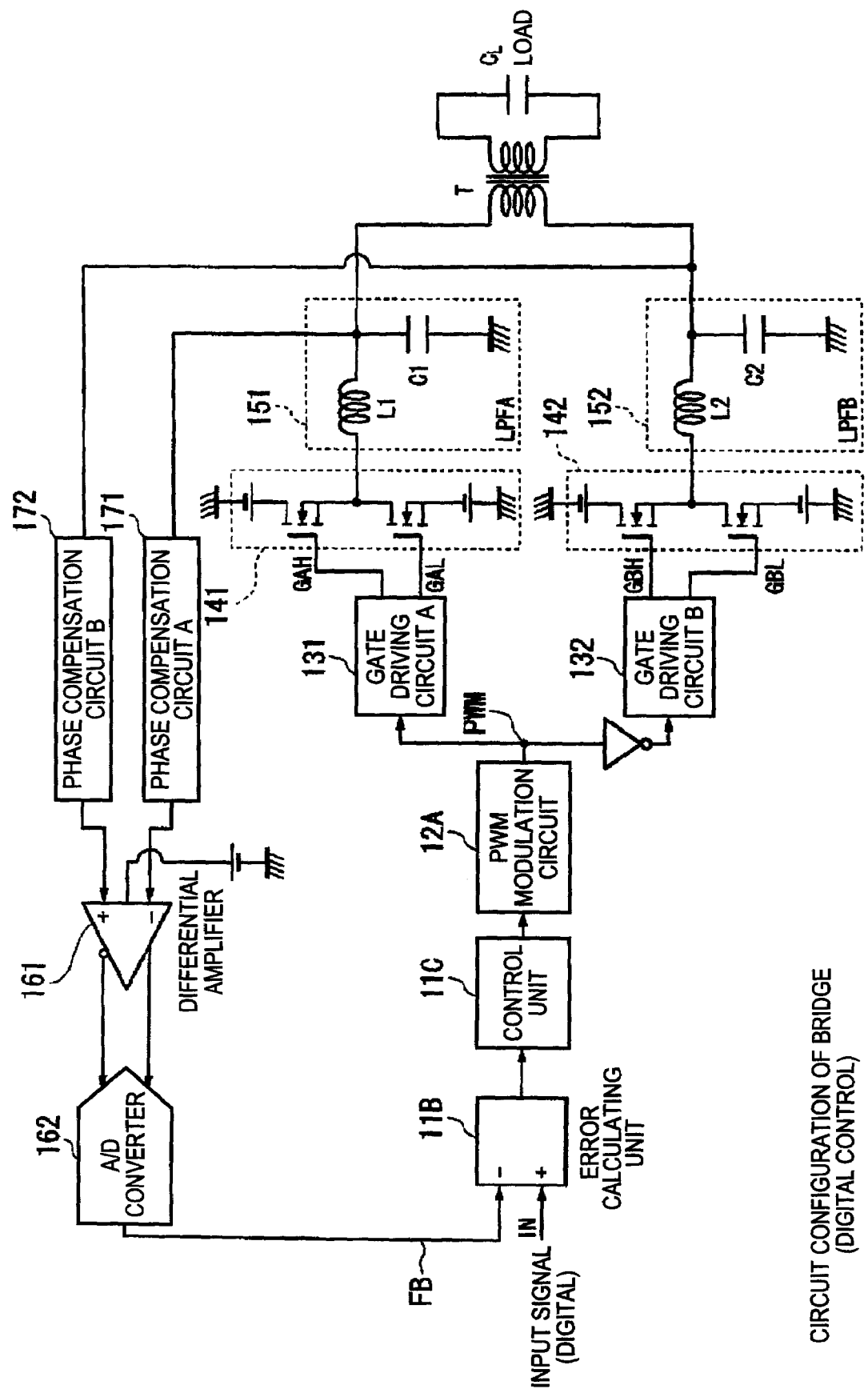
FIG. 14 is a view showing a circuit structure example of a full-bridge by a digital control.

Referring to FIG. 14, the balance output from the LPFA 151 and the LPFB 152 is amplified by the differential amplifier 161, and then converted into digital values in an A/D converter 162. Thereafter, error detection between a feedback signal and an input signal and PWM modulation are performed. That is, FIG. 14 shows the configuration where all the successive processes are performed by digital processing. The error calculating unit 11B detects an error between the feedback signal and the input signal, and the control unit 11C controls the ratio of PWM modulation such that an error between input and output (input signal IN and FB signal) is zero. The PWM modulation circuit 12A modulates the output from the control unit 11C using PWM modulation method.

In addition, the error calculating unit 11B, the control unit 11C, and the PWM modulation circuit 12A are configured as a processing unit such as DSP (Digital Signal Processor) and CPU, or a logic circuit.

As described above, the feedback signal is digitized, and thereby the control unit system and the PWM modulation circuit system can be realized as digital circuits (processing unit). Therefore, advanced signal processing and controlling can be operated.

Fourth Embodiment

The fourth exemplary embodiment of the present invention is explained below.

Figure 15:
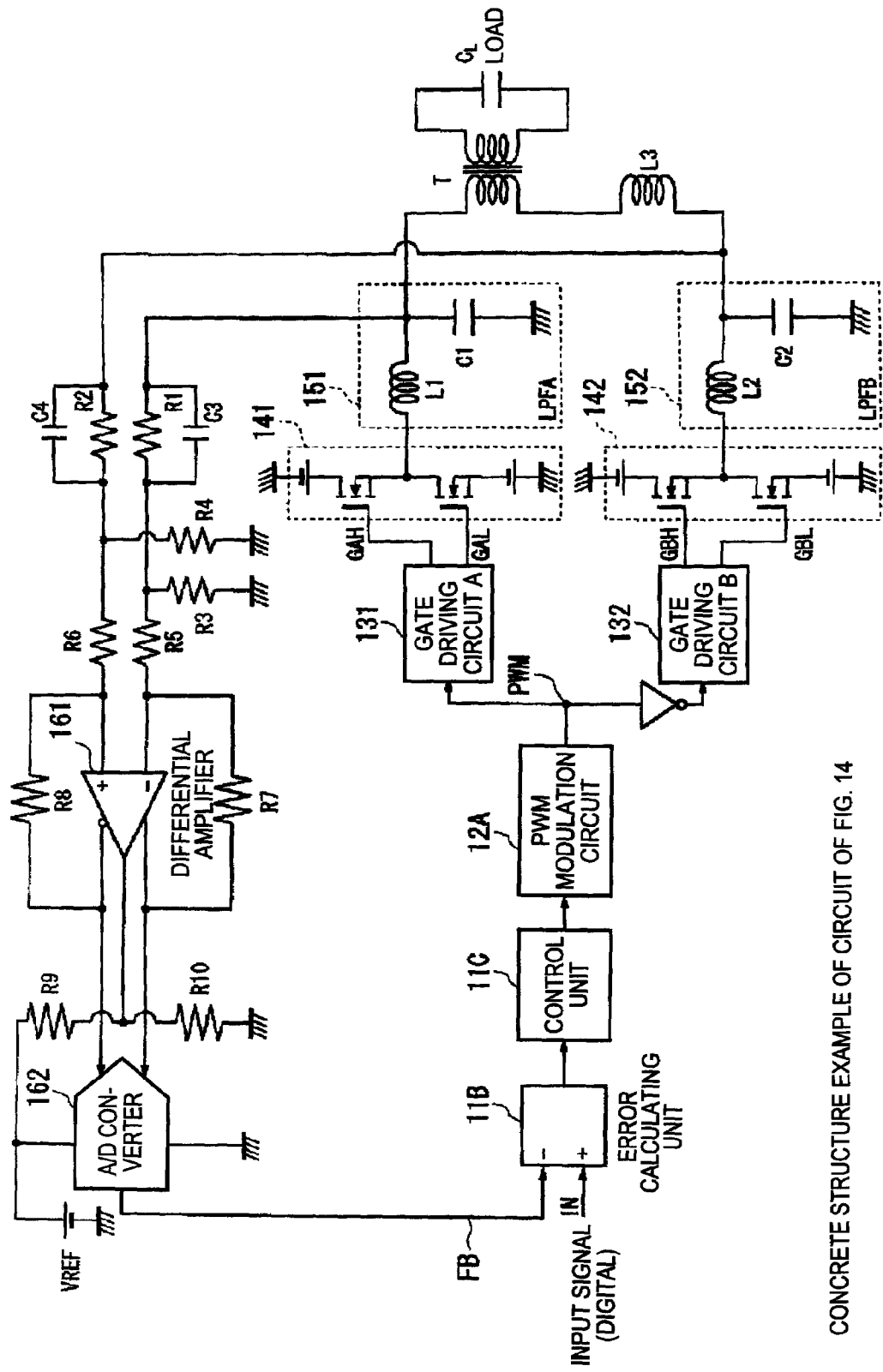
FIG. 15 is a view showing a concrete structure example of the circuit shown in FIG. 14.

FIG. 15 shows a concrete structure example of the feedback circuit system shown in FIG. 14.

In the structure example shown in FIG. 15, a phase-lead compensation circuit is configured with a resistance R1 and a capacitance C3, and a resistance R2 and a capacitance C4. In addition, an attenuator (voltage dividing circuit) is configured with resistances R1 and R3 and resistances R2 and R4. Resistances R5 and R6 are input resistances of the differential amplifier and a gain of the differential amplifier 161 is set up by a ratio of resistances "R7/R5" and "R8/R6".

The balance output of the differential amplifier 161 is inputted to the differential input terminal of the A/D converter 162 having a differential input, and an A/D conversion is carried out through the A/D converter 162. The voltage dividing circuit having resistances R9 and R10 supplies a reference voltage (an offset voltage) for the differential amplifier. In the case of full-bridge configuration, since the feedback signal is the balance signal, the balance signal can be supplied directly to the A/D converter. Therefore, S/N ratio may be increased at the time of A/D conversion.

In addition, an inductance L3 is an inductance component added as an outer coil so as to compensate for a leakage inductance component of the output transformer T. As the leakage inductance of the output transformer T becomes large, the positions of resonance frequencies f3 and f4 go to a low frequency band. Therefore, the removal performance of switching carrier may be enhanced in the LC low-pass filter (LPF). Here, since the leakage inductance component is not supplied from the output transformer T side but an inductance component corresponding to the leakage inductance component is added as an outer coil, the adjustment of component corresponding to the leakage inductance may be facilitated.

Fifth Embodiment

The fifth exemplary embodiment of the present invention is explained below.

Figure 16:
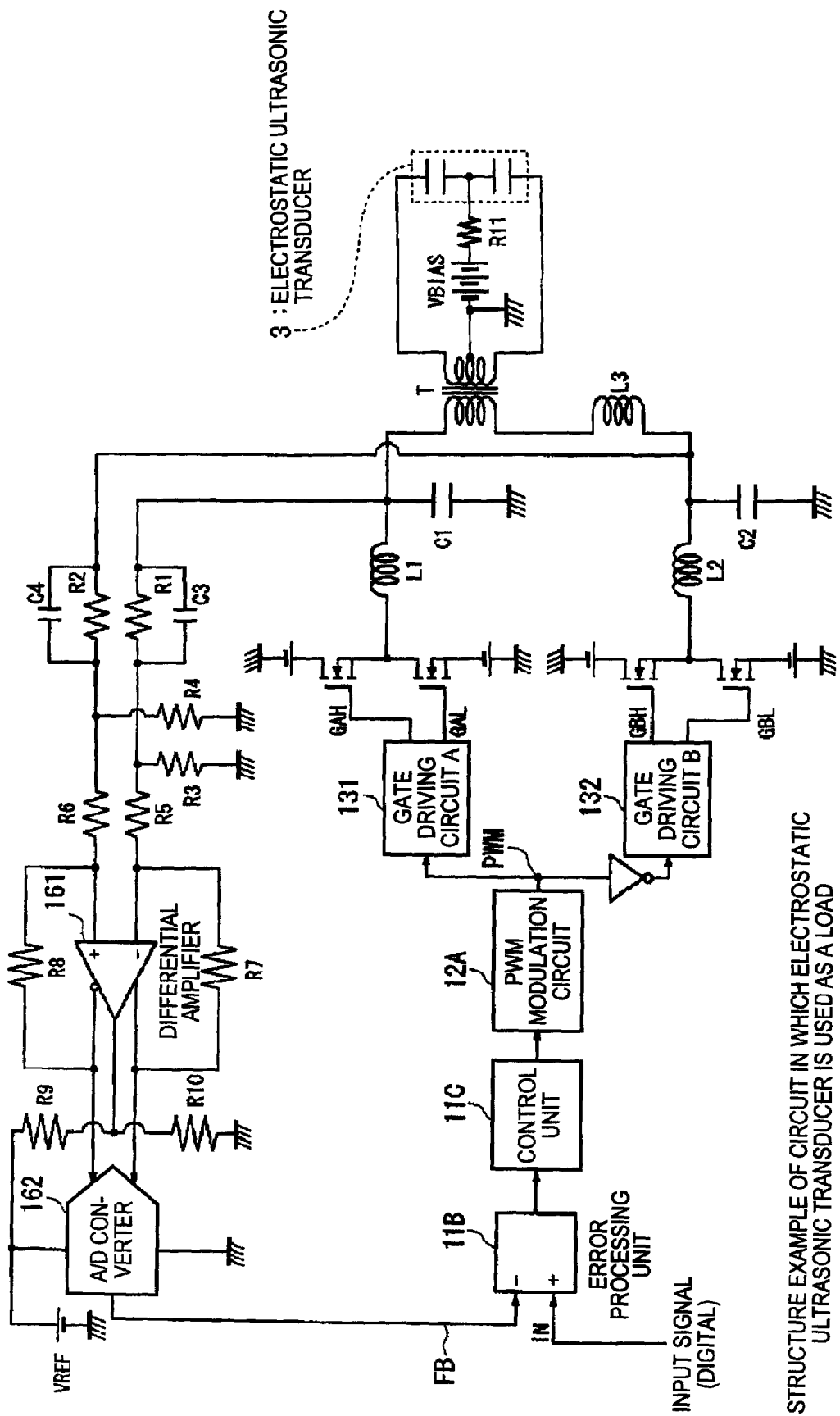
FIG. 16 is a view showing a circuit structure example when an electrostatic ultrasonic transducer is used as a load.

FIG. 16 shows a circuit structure example when the electrostatic ultrasonic transducer is used as a load as shown in FIGS. 11A to 11C.

Referring to the circuit structure example shown in FIG. 16, unlike in FIG. 15, a center tap is provided for the secondary winding of the output transformer T and a direct current bias voltage (VBIAS) is applied to the vibrating membrane electrode of the electrostatic ultrasonic transducer 3 on the base of the center tap.

Through the above-mentioned configuration, the loss may be reduced. In addition, a flat frequency characteristic with respect to a driving frequency band may be realized when an electrostatic transducer in push-pull type is driven using class-D power amplifier.

Sixth Embodiment

Hereinafter, an example of the display device that has the electrostatic transducer according to an embodiment of the invention and uses the electrostatic ultrasonic transducer (hereinafter, referred to as "ultrasonic transducer") driven by the signal of the ultrasonic frequency band will be described.

Figure 17:
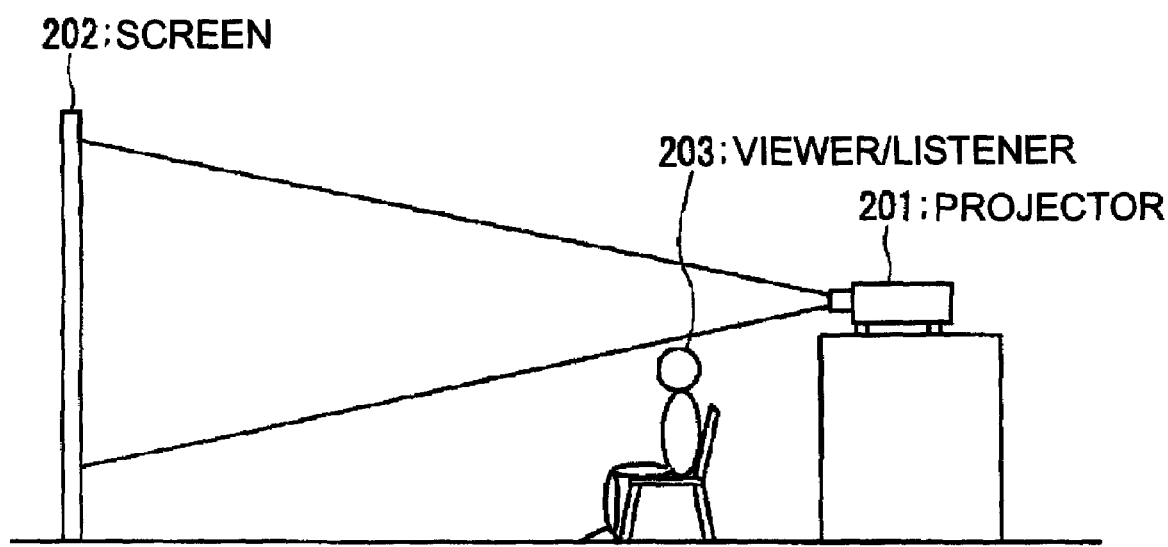
FIG. 17 is a view showing a using state of a projector according to an embodiment of the invention.

FIG. 17 shows an example of the display device, that is, a projector in which the speaker is built-in, and a using state thereof. As shown in FIG. 17, the projector 201 is provided behind a viewer/listener 203, so as to project images onto a screen 202 provided in front of the viewer/listener 203. Simultaneously, a virtual sound source is produced on a projection surface of the screen 202 by the ultrasonic speaker built in the projector 201 so as to reproduce the sound. In addition, the acoustic device using the ultrasonic speaker that forms the virtual sound source on the projector-screen or the projector in which the speaker is built-in is also known as a directional acoustic system.

Figure 18A:
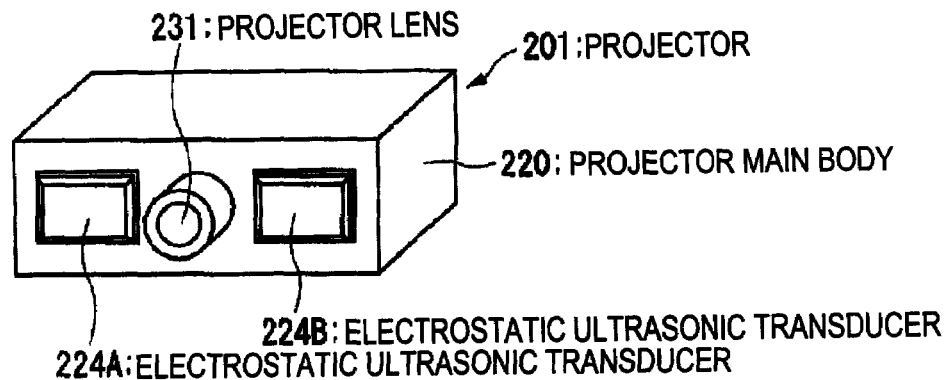
FIGS. 18A and 18B are views showing an exterior structure of the projector shown in FIG. 17.
Figure 18B:
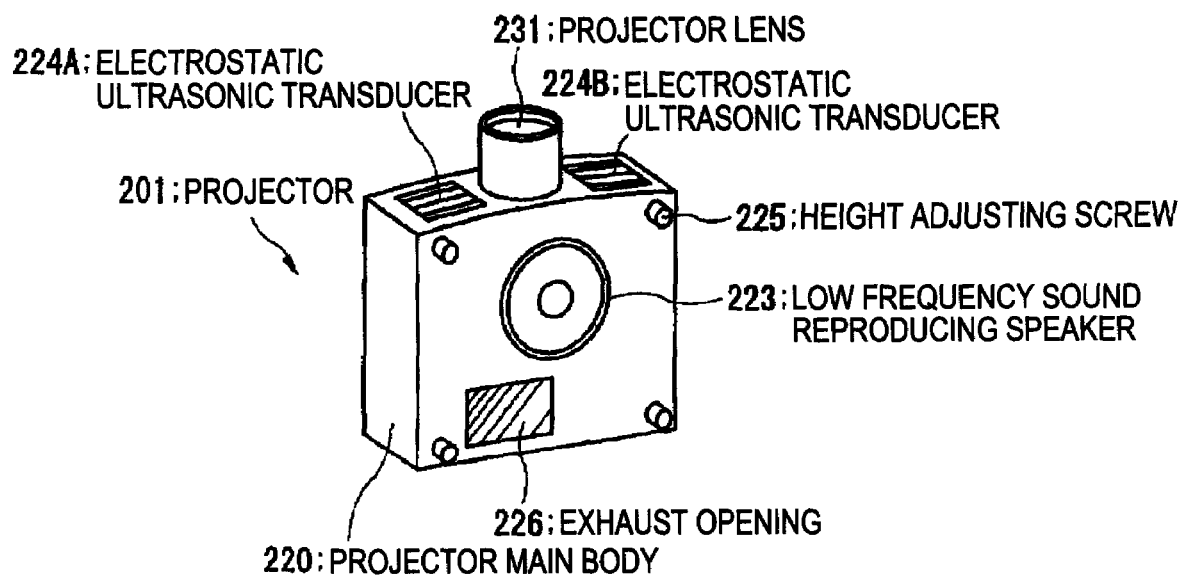

FIGS. 18A and 18B show exterior structures of the projector 201. The projector 201 includes (i) a projector main body 220 including a projection optical system for projecting images onto a projection surface such as a screen, and (ii) an ultrasonic speaker which includes an ultrasonic transducers 224A and 224B which can generate the sound wave in the ultrasonic frequency band and which reproduces the signal sound in an audible frequency band, which is originally included in a sound signal supplied from a sound source. The projector main body 220 and the ultrasonic speaker are integrally constructed as the projector 201. In this embodiment, in order to reproduce a stereo sound signal, the ultrasonic transducers 224A and 224B, which function as ultrasonic speakers, are mounted on the projector main body, where a projector lens 231 for the projection optical system is provided between the ultrasonic transducers 224A and 224B, one of which is disposed at the right and the other of which is disposed at the left.

In addition, on the bottom face of the projector main body 220, a low frequency sound reproducing speaker 223 is provided. Reference numeral 225 indicates a height adjusting screw for adjusting the height of the projector main body 220, and reference numeral 226 indicates an exhaust opening for a cooling fan.

The projector 201 employs the electrostatic transducer according to the embodiment of the invention as the ultrasonic transducers 224A and 224B configuring the ultrasonic speaker. The ultrasonic transducers 224A and 224B are configured so as to be driven by the negatively feedback controlled driving circuit including the class-D power amplifier, filter, and transformer or the like. With this configuration, the flat output frequency characteristic may be obtained, and the loss of the entire driving circuit becomes small. For this reason, the acoustic signal with high sound pressure in the broad frequency band (sound wave in the ultrasonic frequency band) may be generated.

By changing the frequency of the carrier wave and controlling the spatial reproduction area of the reproduced signal in the audible frequency band, sound effects which can be obtained by a stereo surround system or a 5.1 ch surround system can be realized without a large-scale acoustic system which is conventionally necessary, and it is also easy to carry the projector.

Figure 19:
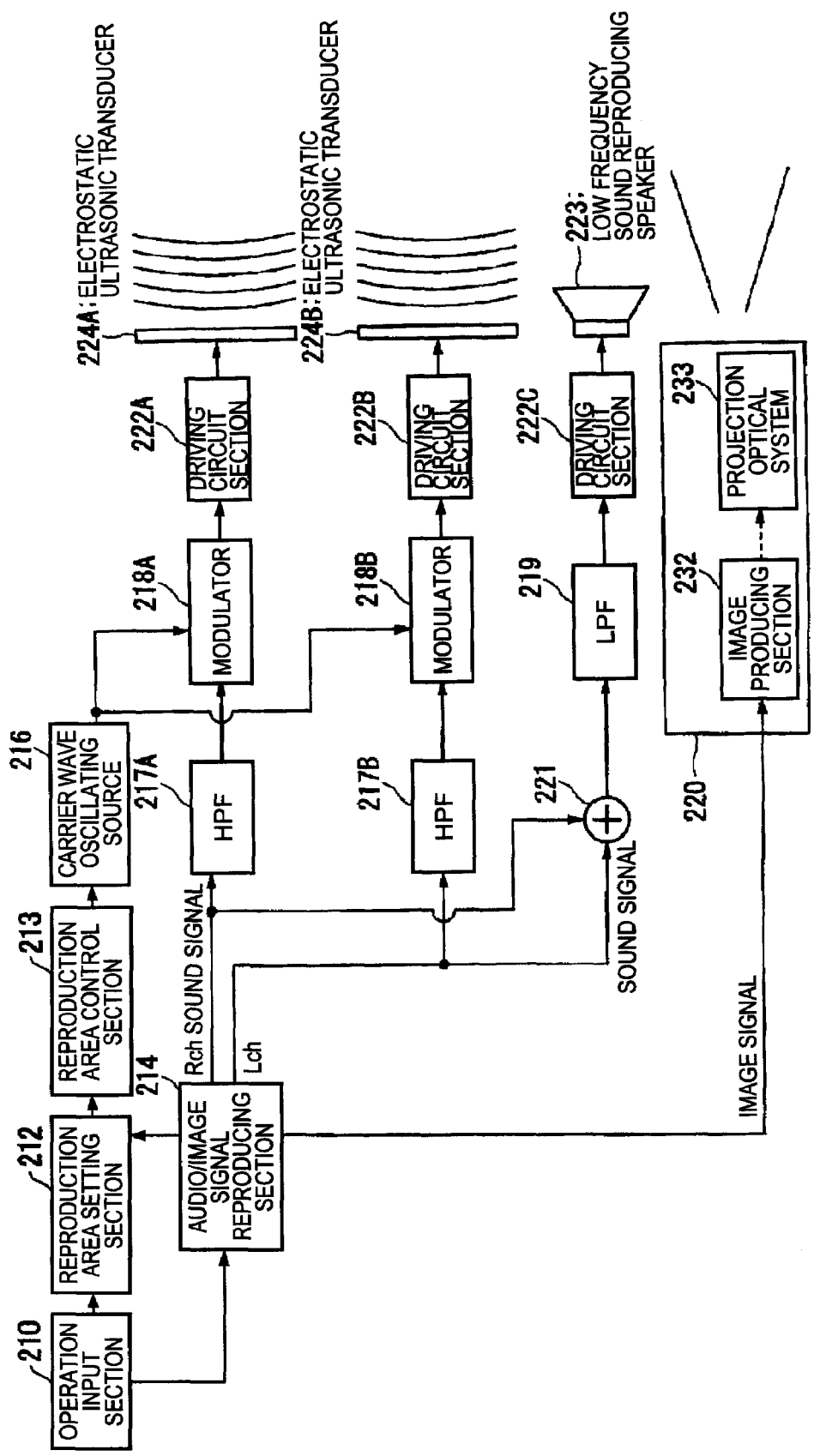
FIG. 19 is a block diagram showing an electrical structure of the projector shown in FIG. 17.

FIG. 19 shows the electric structure of the projector 201. The projector 201 includes an operation input section 210, a reproduction area setting section 212, a reproduction area control section 213, an audio/image signal reproducing section 214, a carrier wave oscillating source 216, modulators 218A and 218B, the ultrasonic speaker including driving circuit sections 222A and 222B, and the ultrasonic transducers 224A and 224B, high-pass filters 217A and 217B, a low-pass filter 219, a mixer 221, a power amplifier 222C, a low sound reproducing frequency speaker 223, and the projector main body 220. Furthermore, the driving circuit sections 222A and 222B are shown in FIGS. 1, 6, 7, 13, 14, 15, and 16, and serves as the driving circuit of the capacitance load (electrostatic transducer).

The projector main body 220 includes an image producing section 232 for producing images and a projection optical system 233 for projecting produced images onto a projection surface. As described above, the projector 201, the ultrasonic speaker, the low frequency sound reproducing speaker 223, and the projector main body 220 are integrally formed.

The operation input section 210 has various functional keys including ten keys, numerical keys, and a power key for switching the power on and off. The reproduction area setting section 212 is provided for input by a user, who operates the keys of the operation input section 210, to input data for designating a reproduction area of the reproduced signal (a signal sound). When such data is inputted into the reproduction area setting section 212, the frequency of the carrier wave for determining the reproduction area of the reproduced signal is set and stored. Specifically, the setting of the reproduction area of the reproduced signal is performed by designating a range or an arrival distance of the reproduced signal from the sound wave emitting surface of the ultrasonic transducers 224A and 224B along the emission axis to an arrival point.

The reproduction area setting section 212 also receives a control signal which is outputted from the audio/image signal reproducing section 214 in accordance with the image contents so as to set the frequency of the carrier wave.

The reproduction area control section 213 refers to the data set in the reproduction area setting section 212 and controls the carrier wave oscillating source 216 so as to realize the set reproduction area by changing the frequency of the carrier wave generated by the carrier wave oscillating source 216.

For example, when the arrival distance corresponding to a frequency of the carrier wave of 50 kHz is defined as the data set in the reproduction area setting section 212, the carrier wave oscillating source 216 is controlled to oscillate at 50 kHz.

The reproduction area control section 213 includes a storage section for storing a table which indicates relationships between the frequency of the carrier wave and the arrival distance of the reproduced signal from the sound wave emitting surface of the ultrasonic transducers 224A and 224B along the emission axis to an arrival point. The data of this table can be obtained by actually measuring the relationships between the frequency of the carrier wave and the arrival distance of the reproduced signal.

Based on the data defined in the reproduction area setting section 212, the reproduction area control section 213 obtains the frequency of the carrier wave corresponding to the defined distance data by referring to the table, and controls the carrier wave oscillating source 216 so as to oscillate at obtained frequency.

The audio/image signal reproducing section 214 is, for example, a DVD player which uses a DVD as an image storage medium. The reproduced audio signal includes an R-channel audio signal and an L channel audio signal which are respectively output to the modulator 218A via the high-pass filter 217A and the modulator 218B via the high-pass filter 217B, and the image signal is outputted to the image producing section 232 of the projector main body 220.

Simultaneously, the R-channel and L-channel audio signals outputted from the audio/image signal reproducing section 214 are mixed using the mixer 221 and the mixed signal is inputted via the low-pass filter 219 into the power amplifier 222C. The audio/image signal reproducing section 214 corresponds to the sound source.

The high-pass filter 217A has characteristics of making only a medium-high frequency component of the R-channel audio signal pass through the filter, and similarly, the high-pass filter 217B has characteristics of making only a medium-high frequency component of the L-channel audio signal pass through the filter. In addition, the low pass filter has characteristics of making only low frequency components of the R-channel and L-channel audio signal pass through the filter.

Therefore, the medium-high frequency audio signals included in the R-channel and L-channel audio signals are respectively reproduced by the ultrasonic transducers 224A and 224B, and the low-frequency audio signals included in the R-channel and L-channel audio signals are reproduced by the low frequency sound reproducing speaker 223.

Furthermore, the audio/image signal reproducing section 214 is a DVD player; however, this is not a limiting feature. The audio/image signal reproducing section 214 may be any reproduction device for reproducing a video signal inputted from an external device. In order to dynamically change the reproduction area of the reproduced sound so as to producing a sound effect suitable for a reproduced image scene, the audio/image signal reproducing section 214 has a function of outputting a control signal for designating the reproduction area to the reproduction area setting section 212.

The carrier wave oscillating source 216 generates a carrier wave having a frequency in an ultrasonic frequency band, as designated by the reproduction area setting section 212, and outputs the generated carrier wave to the modulators 218A and 218B.

The modulators 218A and 218B subject the carrier wave supplied from the carrier wave oscillating source 216 to AM modulation using an audio signal in an audible frequency band outputted from the audio/image signal reproducing section 214, and the modulated signals are respectively outputted to the driving circuit sections 222A and 222B.

The ultrasonic transducers 224A and 224B are respectively driven by the modulated signals output via the driving circuit sections 222A and 222B from the modulators 218A and 218B. Each ultrasonic transducer has a function of converting the modulated signal to a sound wave having a finite amplitude level and emitting the sound wave into a medium, so as to reproduce an audio signal (a reproduced signal) in an audible frequency band.

The image producing section 232 includes a display such as an LCD (liquid crystal display) or a PDP (plasma display panel), a drive circuit for driving the display based on the image signal outputted from the audio/image signal reproducing section 214, etc. Therefore, the image producing section 232 produces an image obtained by the image signal which is outputted from the audio/image signal reproducing section 214.

The projection optical system 233 has a function of projecting the image onto a projection surface such as a screen, provided in front of the projector main body 220.

Hereinafter, the operation of the projector 201 having the above structure will be described. According to a key operation by a user, data for designating a reproduction area of the reproduced signal (distance data) is inputted from the operation input section 210 to the reproduction area setting section 212, and a signal for instructing reproduction is outputted to the audio/image signal reproducing section 214.

As a result, the distance data for defining the reproduction area is set in the reproduction area setting section 212, and the reproduction area control section 213 obtains the distance data set in the reproduction area setting section 212 and refers to the table stored in its inner storage, so as to determine the carrier frequency corresponding to the distance data. The reproduction area control section 213 then controls the carrier wave oscillating source 216 so as to generate a carrier wave having the above frequency.

Accordingly, the carrier wave oscillating source 216 generates a carrier wave having a frequency corresponding to the distance data set in the reproduction area setting section 212, and outputs the generated carrier wave to the modulators 218A and 218B.

On the other hand, the audio/image signal reproducing section 214 outputs the reproduced audio and image signals, that is, outputs (i) the R-channel audio signal via the high-pass filter 217A to the modulator 218A, (ii) the L-channel audio signal via the high-pass filter 217B to the modulator 218B, (iii) the R-channel and L-channel audio signals to the mixer 221, and (iv) the image signal to the image generating section 232 of the projector main body 220.

Accordingly, the medium-high frequency audio signal included in the R-channel audio signal is inputted into the modulator 218A via the high-pass filter 217A, and the medium-high frequency audio signal included in the L-channel audio signal is inputted into the modulator 218B via the high-pass filter 217B.

In addition, the R-channel and L-channel audio signals are mixed by the mixer 221, and the low frequency audio signal included in the mixed signal of the R-channel and L-channel audio signals is inputted to the power amplifier 222C via the low-pass filter 219.

In the image producing section 232, an image is produced by driving the display based on the inputted image signal and is displayed. The image displayed on the display is projected onto a projection surface, for example, the screen 202 shown in FIG. 17 by the projection optical system 233.

The modulator 218A subjects the carrier wave output from the carrier wave oscillating source 216 to AM modulation using the medium-high frequency audio signal which is included in the R-channel audio signal and is outputted from the high-pass filter 217A, and outputs the modulated signal to the driving circuit section 222A.

The modulator 218B subjects the carrier wave output from the carrier wave oscillating source 216 to AM modulation using the medium-high frequency audio signal which is included in the L-channel audio signal and is outputted from the high-pass filter 217B, and outputs the modulated signal to the driving circuit section 222B.

The modulated signals amplified by the driving circuit sections 222A and 222B are applied between the front side fixed electrode 10A and the rear side electrode 10B of each of the ultrasonic transducers 224A and 224B (see FIGS. 11A to 11C), respectively, so that each modulated signal is converted to a sound wave (acoustic signal) having a finite amplitude level. The modulated signal is then emitted into a medium (for example, air). Accordingly, the medium-high frequency audio signal in the above R-channel audio signal is reproduced from the ultrasonic transducer 224A, and the medium-high frequency audio signal in the above L-channel audio signal is reproduced from the ultrasonic transducer 224B.

On the other hand, the low frequency audio signal, which was included in the R- and L-channels and was amplified by the power amplifier 222C, is reproduced from the low frequency sound reproducing speaker 223.

As described above, a non-linear effect of the medium (here, air), relating to the present invention, will be briefly explained here. As is known, in transmission of an ultrasonic wave emitted into the air by an ultrasonic transducer, the wave has a higher sound velocity if it has a higher sound pressure and a lower sound velocity if it has a lower sound pressure, thereby causing a distortion in the waveform of the transmitted wave.

When a signal in an ultrasonic frequency band (for example, the carrier wave) to be emitted is modulated (AM-modulated) in advance by a signal in an audible frequency band, the above-explained distortion in the waveform causes isolation of the signal wave in the audible frequency band, which is used in the modulation, from the carrier wave in the ultrasonic frequency band, thereby causing self-demodulation and reproduction of the above audio signal wave. Also in this process, the reproduced signal proceeds in the form of a beam due to the characteristics of the ultrasonic wave, so that sound is reproduced and projected in a specific direction. This is completely different from reproduction using ordinary speakers.

The beam-form reproduced signal, which is output from the ultrasonic transducers 224A and 224B as a component of the ultrasonic speaker, is emitted into a projection surface (for example, a screen), on which images are projected by the projection optical system 233, and is reflected and diffused by the projection surface. The distance from the face of the ultrasonic transducer 224A or 224B, from which the sound wave is emitted, to a position where the reproduced signal is isolated from the carrier wave, measured along the emission axis (the normal), and the width or the spread angle of the beam of the carrier wave are determined depending on the frequency of the carrier wave set in the reproduction area setting section 212. Therefore, the reproduction area changes in accordance with a difference in the above distance and the beam width.

Figure 20:
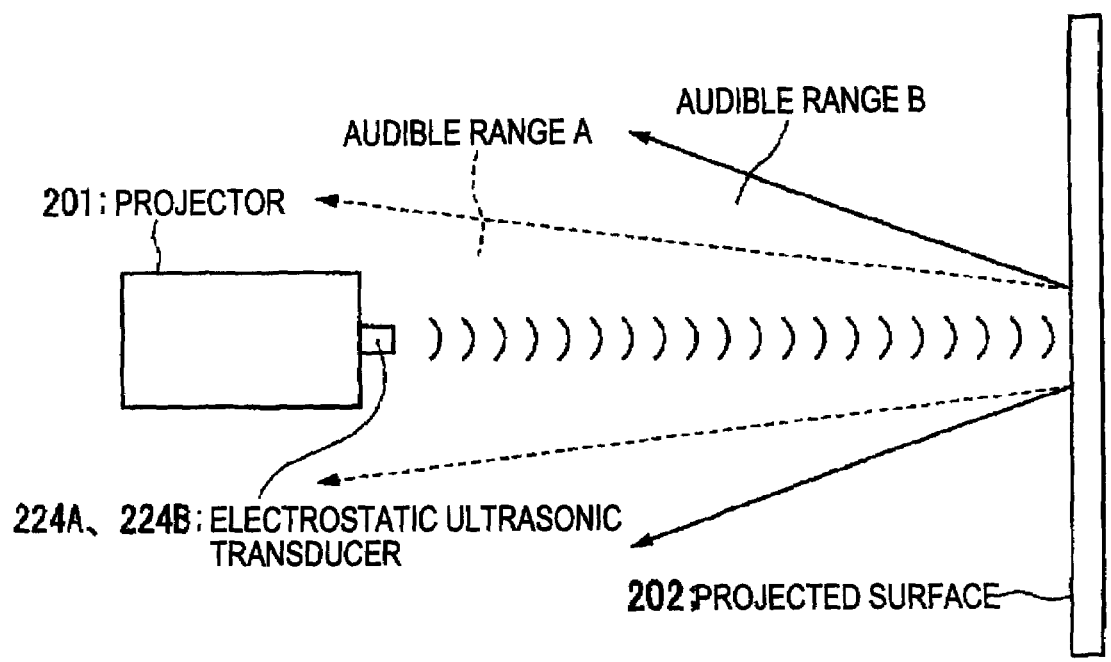
FIG. 20 is a view explaining a reproduction state of a reproduction signal by the ultrasonic transducer.
Figure 21A:
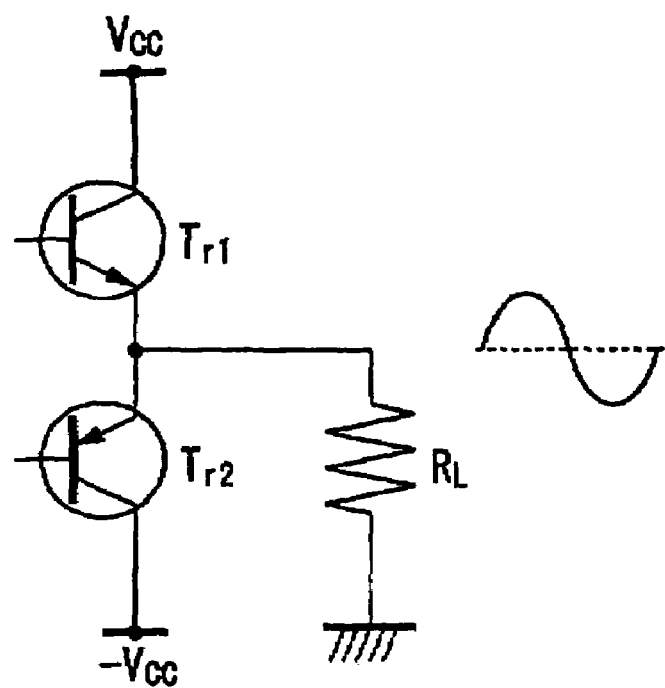
FIGS. 21A and 21B are views showing an example of single end push pull circuit.
Figure 21B:
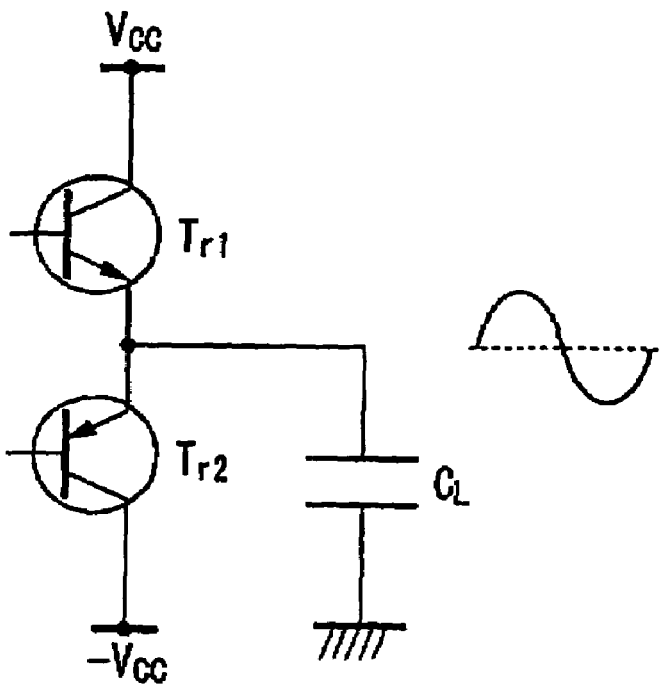
Figure 22A:
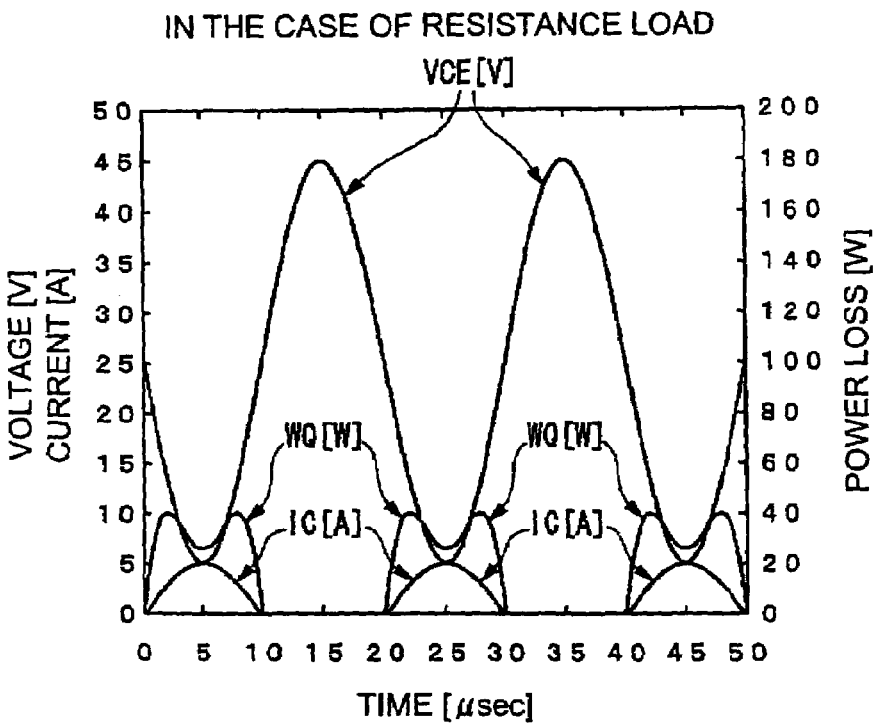
FIGS. 22A and 22B are views showing an example of a power loss generating in an analog power amplifier.
Figure 22B:
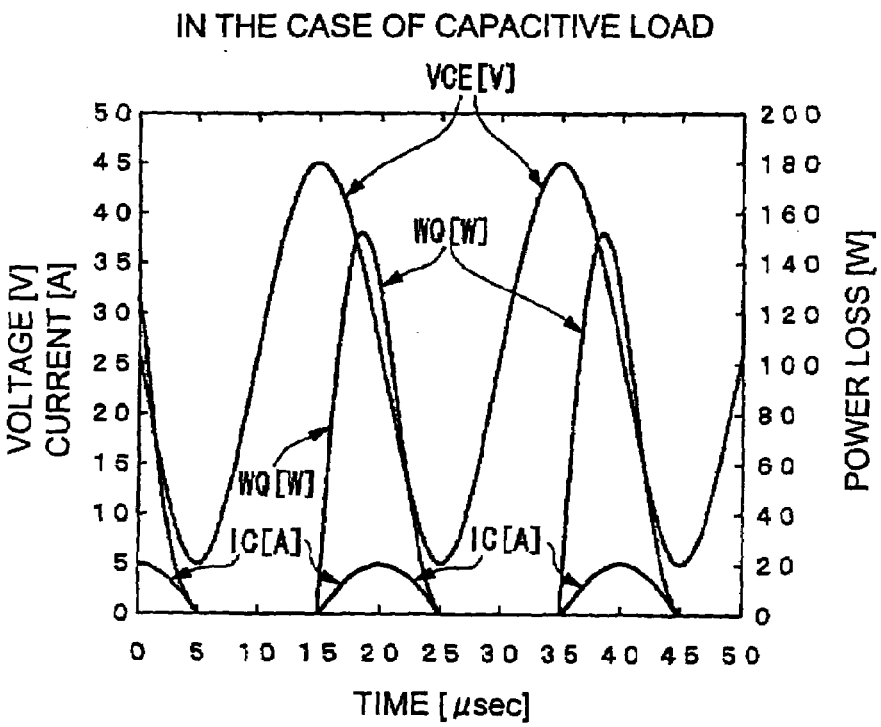
Figure 23:
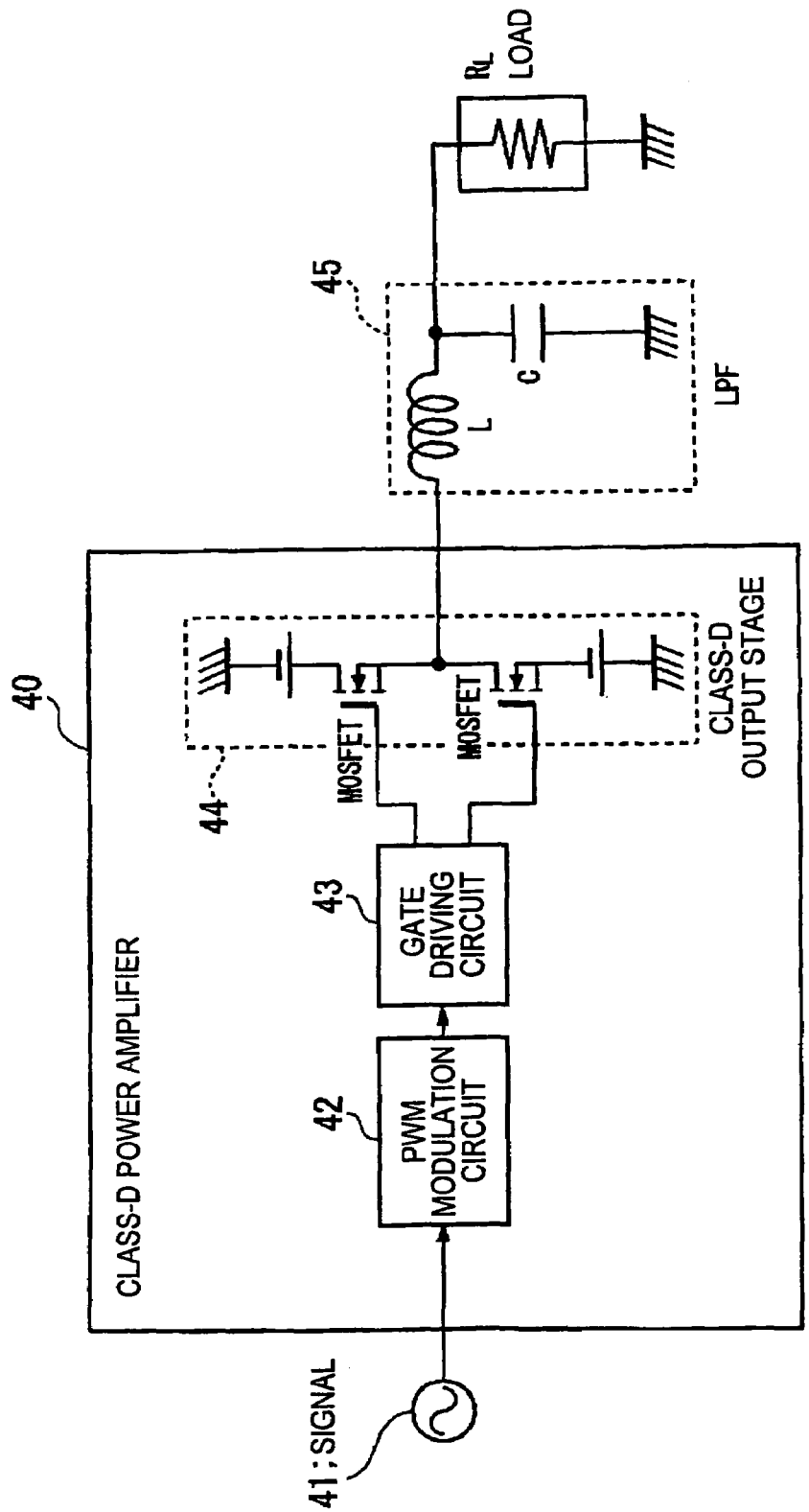
FIG. 23 is a view showing a general structure example of class-D power amplifier.
Figure 24:
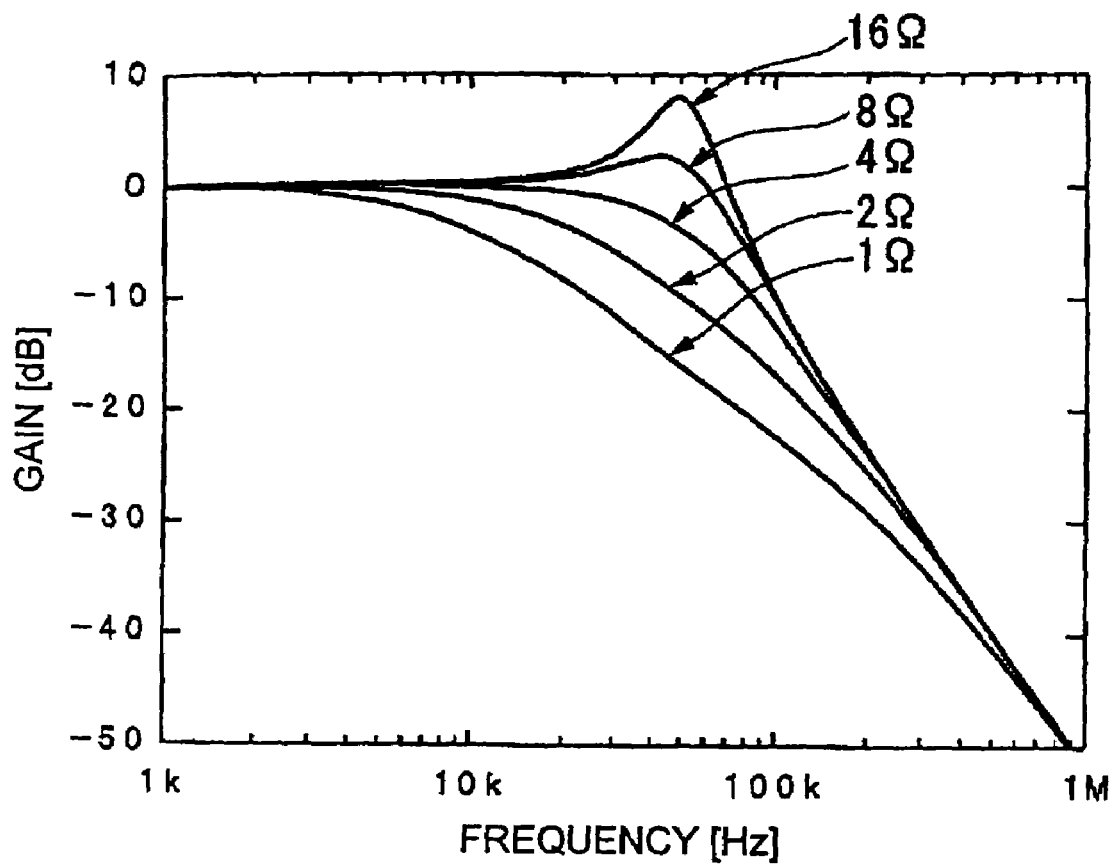
FIG. 24 is a view showing a frequency characteristic of a second-order LC low-pass filter.

FIG. 20 shows examples of reproduction of the reproduced signal by using the ultrasonic speaker realized by the ultrasonic transducers 224A and 224B in the projector 201. When the ultrasonic transducers are driven by the modulated signals obtained by modulating the carrier wave by an audio signal in the projector 201, if the carrier frequency set via the reproduction area setting section 212 is low, the distance from the sound wave emitting surface of the ultrasonic transducers 224A and 224B, to a position where the reproduced signal is isolated from the carrier wave, measured along the emission axis (i.e., the normal with respect to the sound wave emitting surface), that is, the distance up to the reproduction point, is relatively long.

Therefore, the beam of the reproduced signal in an audible frequency band reaches the projection surface (for example, the screen) 202 while the spread of the beam is relatively small. When the reproduced signal is reflected by the projection surface 202, the audible area indicated by dotted arrows in FIG. 20 is obtained, so that the reproduced signal (the reproduced sound) can be heard only in an area which is relatively far from the projection surface 202 and relatively narrow.

Conversely, when the carrier frequency set via the reproduction area setting section 212 is higher than that in the above case, the sound wave emitted from the sound wave emitting surface of the ultrasonic transducers 224A and 224B is wider than that in the case of using a lower carrier frequency; however, the distance from the sound wave emitting surface to a position where the reproduced signal is isolated from the carrier wave, measured along the emission axis (i.e., the normal with respect to the sound wave emitting surface), that is, the distance up to the reproduction point, is relatively short.

Therefore, the beam of the reproduced signal in an audible frequency band spreads before reaching the projection surface 202. When this reproduced signal reaches and is reflected by the projection surface 202, the audible area B indicated by solid arrows in FIG. 20 is obtained, so that the reproduced signal (the reproduced sound) can be heard only in an area which is relatively close to the projection surface 202 and is relatively wide.

As described above, the ultrasonic speaker that can drive with the low loss and has the flat output frequency characteristic may be used in the display device 9 (for example, projector). The ultrasonic speaker may be driven with the low loss and ensures the flat output frequency characteristic in the driving frequency band. For this reason, the acoustic signal having sufficient sound pressure and the broadband characteristic may be reproduced so as to generate from a virtual sound source formed on the sound wave reflecting surface such as a screen. In addition, the reproducing range of the acoustic signal may be easily controlled.

In addition, the projector is used for projecting images on the large-screen. However, recently, since large-screen liquid television or large-screen plasma television is widely popularized, the ultrasonic speaker using the electrostatic transducer according to the embodiment of the invention may be effectively used in even the large-screen television.

That is, by using the ultrasonic speaker in the large-screen television, the sound signal may be locally emitted to the front of the large-screen television.

While the invention has been particularly shown and described with reference to the embodiments thereof, the capacitive load driving circuit, electrostatic transducer, and display device are not limited to the above embodiments, but various changes in form and details may be made therein without departing from the spirit and scope of the invention as defined by the appended claims.

What is claimed is:

1. A capacitive load driving circuit, comprising:
an error amplification circuit, including input terminals, that amplifies a difference between an external input signal provided to one input terminal and a negative feedback signal provided from the following negative feedback circuit to the other input terminal;
a modulation circuit that pulse-modulates the signal outputted from the error amplification circuit;
a power switching circuit that switches between a power supply voltage and a ground potential or between a positive power supply voltage and a negative power supply voltage;
a gate driving circuit that generates a gate driving signal to switch-control a switching element configuring the power switching circuit, from a modulated signal outputted from the modulation circuit;
a low-pass filter, connected to an output side of the power switching circuit, that removes switching carrier components included in an output signal of the power switching circuit;
an output transformer that boosts an output signal of the low-pass filter and that has a primary winding connected to an output terminal of the low-pass filter;
a capacitive load connected in parallel with a secondary winding of the output transformer; and
a negative feedback circuit, that performs negative feedback from the output terminal of the low-pass filter, to provide the negative feedback signal to the input terminal of the error amplification circuit.

2. The capacitive load driving circuit according to claim 1, the error amplification circuit including an integrator.

3. The capacitive load driving circuit according to claim 1, the low-pass filter being a second-order LC low-pass filter.

4. The capacitive load driving circuit according to claim 1, the negative feedback circuit including a phase compensation circuit.

5. The capacitive load driving circuit according to claim 1,
an output circuit formed by the low-pass filter, the output transformer, and a load capacitance having two parallel resonance frequencies f1 and f3 and two serial resonance frequencies f2 and f4 (f1<f2 <f3<f4), as viewed from an input side, and
a constant of each circuit element configuring the output circuit being set so that the first parallel resonance frequency f1 of the resonance frequencies matches or approximately matches a rated driving frequency or a carrier wave frequency fd of the capacitive load.

6. The capacitive load driving circuit according to claim 1,
an output circuit formed by the low-pass filter, the output transformer, and a load capacitance having two parallel resonance frequencies f1 and f3 and two serial resonance frequencies f2 and f4 (f1<f2<f3<f4), as viewed from an input side, and
a constant of each circuit element configuring the output circuit being set so that the first serial resonance frequency f2 of the resonance frequencies matches or approximately matches a cutoff frequency fc in a driving frequency band of the capacitive load.

7. The capacitive load driving circuit according to claim 1,
an output circuit formed by the low-pass filter, the output transformer, and a load capacitance having two parallel resonance frequencies f1 and f3 and two serial resonance frequencies f2 and f4 (f1<f2<f3<f4), as viewed from an input side, and
a leakage inductance of the output transformer and the other circuit constant being set so that the second serial resonance frequency f4 of the resonance frequencies is positioned below a modulation frequency band of the modulation circuit.

8. The capacitive load driving circuit according to claim 1,
the capacitive load being an electrostatic transducer,
the electrostatic transducer including a first electrode that has a plurality of holes, a second electrode that has a plurality of holes making pairs with the holes of the first electrode, and a vibrating film that has a conductive layer and is inserted between a pair of electrodes formed with the first and second electrodes, a direct current bias voltage being applied to the conductive layer,
the secondary winding of the output transformer being provided with a center tap,
one terminal of the secondary winding of the output transformer being connected to a first electrode of the electrostatic transducer, and the other terminal thereof being connected to a second electrode of the electrostatic transducer, and
the direct current bias voltage based on the center tap of the secondary winding of the output transformer being applied to the conductive layer of the vibrating film.

9. An electrostatic transducer, comprising:
an error amplification circuit, including input terminals, that amplifies a difference between an external input signal provided to one input terminal and a negative feedback signal provided from the following negative feedback circuit to the other input terminal;
a modulation circuit that pulse-modulates the signal outputted from the error amplification circuit;
a power switching circuit that switches between a power supply voltage and a ground potential or between a positive power supply voltage and a negative power supply voltage;

a gate driving circuit that generates a gate driving signal to switch-control a switching element configuring the power switching circuit, from a modulated signal outputted from the modulation circuit;

a low-pass filter, connected to an output side of the power switching circuit, that removes switching carrier components included in an output signal of the power switching circuit;

a negative feedback circuit, that performs negative feedback from the output terminal of the low-pass filter, to provide the negative feedback signal to the input terminal of the error amplification circuit; and an output transformer that boosts an output signal of the low-pass filter and has a primary winding connected to an output terminal of the low-pass filter;

the electrostatic transducer being connected in parallel with a secondary winding of the output transformer and driven as a capacitive load.

10. The electrostatic transducer according to claim 9, the error amplification circuit including an integrator.

11. The electrostatic transducer according to claim 9, the low-pass filter being a second-order LC low-pass filter.

12. The electrostatic transducer according to claim 9, the negative feedback circuit including a phase compensation circuit.

13. The electrostatic transducer according to claim 9, an output circuit formed by the low-pass filter, the output transformer, and a load capacitance having two parallel resonance frequencies f1 and f3 and two serial resonance frequencies f2 and f4 (f1<f2<f3<f4), as viewed from an input side, and a constant of each circuit element configuring the output circuit being set so that the first parallel resonance frequency f1 of the resonance frequencies matches or approximately matches a rated driving frequency or a carrier wave frequency fd of the electrostatic transducer.

14. The electrostatic transducer according to claim 9, an output circuit formed by the low-pass filter, the output transformer, and a load capacitance having two parallel resonance frequencies f1 and f3 and two serial resonance frequencies f2 and f4 (f1<f2<f3<f4), as viewed from an input side, and a constant of each circuit element configuring the output circuit being set so that the first serial resonance frequency f2 of the resonance frequencies matches or approximately matches a cutoff frequency fc in a driving frequency band of the electrostatic transducer.

15. The electrostatic transducer according to claim 9, an output circuit formed by the low-pass filter, the output transformer, and a load capacitance having two parallel resonance frequencies f1 and f3 and two serial resonance frequencies f2 and f4 (f1<f2<f3<f4), as viewed from an input side, and a leakage inductance of the output transformer and the other circuit constant being set so that the second serial resonance frequency f4 of the resonance frequencies is positioned below a modulation frequency band of the modulation circuit.

16. The electrostatic transducer according to claim 9, the electrostatic transducer including a first electrode that has a plurality of holes, a second electrode that has a plurality of holes making pairs with the holes of the first electrode, and a vibrating film that has a conductive layer and is inserted between a pair of electrodes formed by the first and second electrodes, a direct current bias voltage being applied to the conductive layer, the secondary winding of the output transformer being provided with a center tap, one terminal of the secondary winding of the output transformer being connected to a first electrode of the electrostatic transducer, and the other terminal thereof being connected to a second electrode of the electrostatic transducer, and the direct current bias voltage based on the center tap of the secondary winding of the output transformer being applied to the conductive layer of the vibrating film.

17. A method of setting a circuit constant, comprising:

amplifying a difference between an external input signal and a negative feedback signal from an output side by an error amplification circuit;

pulse-modulating the signal outputted from the error amplification circuit by a modulation circuit;

switching between a power supply voltage and a ground potential or between a positive power supply voltage and a negative power supply voltage by a power switching circuit;

generating a gate driving signal to switch-control a switching element configuring the power switching circuit, from a modulated signal outputted from the modulation circuit by a gate driving circuit;

removing switching carrier components included in an output signal of the power switching circuit by a low-pass filter that is connected to an output side of the power switching circuit;

performing a negative feedback from the output terminal of the low-pass filter to an input terminal of the error amplification circuit by a negative feedback circuit;

boosting an output signal of the low-pass filter by an output transformer in which a primary winding is connected to an output terminal of the low-pass filter and a secondary winding is connected in parallel with the electrostatic transducer serving as a capacitive load;

setting an output circuit formed by the low-pass filter, the output transformer, and a load capacitance so as to have two parallel resonance frequencies f1 and f3 and two serial resonance frequencies f2 and f4 (f1<f2<f3<f4), as viewed from an input side; and setting a constant of each circuit element configuring the output circuit so that the first parallel resonance frequency f1 of the resonance frequencies matches or approximately matches a rated driving frequency or a carrier wave frequency fd of the electrostatic transducer.

18. An ultrasonic speaker, comprising:

an electrostatic transducer that is driven according to a signal in an ultrasonic frequency band;

a modulator that supplies the electrostatic transducer with a modulated signal which is obtained by modulating a carrier wave signal in the ultrasonic frequency band with an acoustic signal in an audible frequency band;

the electrostatic transducer that configures the ultrasonic speaker including:

an error amplification circuit, including input terminals, that amplifies a difference between an external input signal provided to one input terminal and a negative feedback signal provided from the following negative feedback circuit to the other input terminal;

a modulation circuit that pulse-modulates the signal outputted from the error amplification circuit;

a power switching circuit that switches between a power supply voltage and a ground potential or between a positive power supply voltage and a negative power supply voltage;

a gate driving circuit that generates a gate driving signal to switch-control a switching element configuring the power switching circuit, from a modulated signal outputted from the modulation circuit;

a low-pass filter, connected to an output side of the power switching circuit, that removes switching carrier components included in an output signal of the power switching circuit;

a negative feedback circuit, that negatively feedbacks from the output terminal of the low-pass filter, to provide the negative feedback signal to the input terminal of the error amplification circuit; and an output transformer that boosts an output signal of the low-pass filter and that has a primary winding connected to an output terminal of the low-pass filter, the electrostatic transducer being connected in parallel with a secondary winding of the output transformer and driven as a capacitive load.

19. A display device, comprising:

a projection optical system that projects an image on a projection surface; and an ultrasonic speaker that reproduces a signal sound in an audible frequency band;

the ultrasonic speaker, including;

an electrostatic transducer that is driven according to a signal in an ultrasonic frequency band;

a modulator that supplies the electrostatic transducer with a modulated signal which is obtained by modulating a carrier wave signal in the ultrasonic frequency band with sound signals supplied from an acoustic sound source;

the electrostatic transducer that configures the ultrasonic speaker including;

an error amplification circuit, including an input side and an output side, that amplifies a difference between an external input signal provided to the input side and a negative feedback signal generated from the output side;

a modulation circuit that pulse-modulates the signal outputted from the error amplification circuit;

a power switching circuit that switches between a power supply voltage and a ground potential or between a positive power supply voltage and a negative power supply voltage;

a gate driving circuit that generates a gate driving signal to switch-control a switching element configuring the power switching circuit, from a modulated signal outputted from the modulation circuit;

a low-pass filter, connected to an output side of the power switching circuit, that removes switching carrier components included in an output signal of the power switching circuit;

a negative feedback circuit, that performs negative feedback from the output terminal of the low-pass filter, to provide the negative feedback signal to the input side of the error amplification circuit; and an output transformer that boosts an output signal of the low-pass filter and that has a primary winding connected to an output terminal of the low-pass filter;

the electrostatic transducer being connected in parallel with a secondary winding of the output transformer and driven as a capacitive load.

20. A directional acoustic system, comprising:

an ultrasonic speaker that reproduces a signal sound in a first frequency range of sound signals supplied from an acoustic sound source;

a reproduction speaker that reproduces a signal in a second frequency range of the sound signals supplied from the acoustic sound source;

the ultrasonic speaker, including;

and electrostatic transducer that is driven according to a signal in an ultrasonic frequency band;

a modulator that supplied the electrostatic transducer with a modulated signal which is obtained by modulating a carrier wave signal in the ultrasonic frequency band with the sound signal in the first frequency range of the sound signals supplied from the acoustic sound source;

the electrostatic transducer that configures the ultrasonic speaker including:

an error amplification circuit, including input terminals, that amplifies a difference between an external input signal provided to one input terminal and a negative feedback signal provided from the following negative feedback circuit to the other input terminal;

a modulation circuit that pulse-modulates the signal outputted from the error amplification circuit;

a power switching circuit that switches between a power supply voltage and a ground potential or between a positive power supply voltage and a negative power supply voltage;

a gate driving circuit that generates a gate driving signal to switch-control a switching element configuring the power switching circuit, from a modulated signal outputted from the modulation circuit;

a low-pass filter, connected to an output side of the power switching circuit, that removes switching carrier components included in an output signal of the power switching circuit;

a negative feedback circuit, that performs negative feedback from the output terminal of the low-pass filter, to provide the negative feedback signal to the input terminal of the error amplification circuit; and an output transformer that boosts an output signal of the low-pass filter and that has a primary winding connected to an output terminal of the low-pass filter;

the electrostatic transducer being connected in parallel with a secondary winding of the output transformer and driven as a capacitive load.

21. A directional acoustic system, comprising:

an ultrasonic speaker that reproduces a signal sound in a first frequency range of sound signals supplied from an acoustic sound source; and a reproduction speaker that reproduces a signal sound in a second frequency range of the sound signals supplied from the acoustic sound source;

the ultrasonic speaker, including:

an electrostatic transducer that is driven according to a signal in an ultrasonic frequency band; and a modulator that supplied the electrostatic transducer with a modulated signal which is obtained by modulating a carrier wave signal in the ultrasonic frequency band with the sound signal in the first frequency range of the sound signals supplied from the acoustic sound source; and the electrostatic transducer configuring the ultrasonic speaker including an output circuit formed by a low-pass filter, an output transformer, and a load electrostatic capacitance that has two parallel resonance frequencies $f_1$ and $f_3$ and two serial resonance frequencies $f_2$ and $f_4$, $f_1$ being less than $f_2$, $f_2$ being less than $f_3$, and $f_3$ being less than $f_4$, as viewed from an input side.

* * * * *